(12) United States Patent
Sumi

(10) Patent No.: US 6,853,222 B2
(45) Date of Patent: Feb. 8, 2005

(54) PHASE LOCKED LOOP CIRCUIT HAVING MAIN AND AUXILIARY FREQUENCY DIVIDERS AND MULTIPLE PHASE COMPARISONS

(75) Inventor: Yasuaki Sumi, Tottori (JP)

(73) Assignees: Sanyo Electronic Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 41 days.

(21) Appl. No.: 10/262,191

(22) Filed: Oct. 1, 2002

(65) Prior Publication Data

US 2003/0042948 A1 Mar. 6, 2003

Related U.S. Application Data

(63) Continuation of application No. PCT/JP01/01884, filed on Mar. 9, 2001.

(30) Foreign Application Priority Data

| | | |
|---|---|---|
| Apr. 14, 2000 | (JP) | 2000-113832 |
| Apr. 19, 2000 | (JP) | 2000-117920 |
| Apr. 20, 2000 | (JP) | 2000-119183 |
| May 26, 2000 | (JP) | 2000-156565 |

(51) Int. Cl.⁷ ............................................. H03L 7/06
(52) U.S. Cl. ........................................ 327/156; 327/147
(58) Field of Search ............................ 327/149, 150, 327/152, 153, 156, 158, 161, 147, 162; 331/11, 25, 17, 12; 375/373, 375, 376

(56) References Cited

U.S. PATENT DOCUMENTS

| | | | | |
|---|---|---|---|---|
| 4,550,345 A | * | 10/1985 | Terada et al. | 386/28 |
| 5,152,005 A | * | 9/1992 | Bickley | 455/76 |
| 5,162,746 A | * | 11/1992 | Ghoshal | 327/159 |
| 6,147,561 A | * | 11/2000 | Rhee et al. | 331/12 |

FOREIGN PATENT DOCUMENTS

| | | |
|---|---|---|
| JP | 07154252 | 6/1995 |
| JP | 08186488 | 7/1996 |
| JP | 10022824 | 1/1998 |
| JP | 10135822 | 5/1998 |

* cited by examiner

*Primary Examiner*—Linh M. Nguyen
(74) *Attorney, Agent, or Firm*—William E. Pelton, Esq.

(57) ABSTRACT

A PLL circuit including a generating means (3) for generating a plurality of reference signals (fR1 to fR8) having mutually differing phases, a main frequency divider (30) dividing an output signal (fVCO) of a voltage-controlled oscillator (29) by a frequency-division ratio of N1, an auxiliary frequency divider (31) dividing an output (fV') of the main frequency divider by a frequency-division ratio of N2, a distribution circuit (32) distributing an output (Q1a, Q2a, Q3a) of the auxiliary frequency divider as a plurality of feedback signals (fV1 to fV8), and phase comparators (12 to 19) comparing the reference signals with the feedback signals to output error signals (ER1 to ER8). Each of the main frequency divider and the auxiliary frequency divider is comprised of a variable frequency divider or a counter.

13 Claims, 12 Drawing Sheets

PHASE LOCKED LOOP CIRCUIT HAVING MAIN AND AUXILIARY FREQUENCY DIVIDERS AND MULTIPLE PHASE COMPARISONS

This application is a continuation of PCT International Application No. PCT/JP01/01884, filed Mar. 9, 2001, designating the United States of America, the contents of which are incorporated by reference into the present invention.

FIELD OF THE INVENTION

The present invention relates to a PLL circuit.

BACKGROUND ART

As shown, for example, in the drawing at page 32 of "SANYO TECHNICAL REVIEW" Vol. 10, No. 1, February 1978, a PLL circuit that generates signals of various frequencies from a reference signal having a certain frequency is known. This PLL circuit includes a reference oscillator generating a reference signal RF, a voltage-controlled oscillator generating an output signal FO having a frequency responsive to a control voltage CV, a variable frequency divider dividing the frequency of the output signal FO to generate a feedback signal FV, a phase comparator comparing phases between the feedback signal and the reference signal to generate an error signal ER, and a low-pass filter generating the control signal CV in response to the error signal ER.

However, this PLL circuit has disadvantage of having a long lock-up time (the time until the output signal is synchronized with the reference signal) since its phase comparator is of the single-stage type that performs the phase comparison only once during one period of the reference signal.

There are some PLL circuits that are free from the disadvantage of the long lock-up time. For example, each of Japanese Unexamined Patent Publication 10-135822 and Japanese Unexamined Patent Publication 11-20405 by the inventor identical with the inventor of the present invention discloses a PLL circuit that performs phase comparisons multiple times during one period of the reference signal to shorten the lock-up time.

The PLL circuit disclosed in Japanese Unexamined Patent Publication 10-135822 includes means for generating a plurality of reference signals having mutually differing phases, a plurality of (four, for example) frequency dividers each dividing an output signal of a voltage-controlled oscillator, a plurality of phase comparators each comparing phases between output signals of the frequency dividers and the corresponding reference signals, a plurality of gates disposed at the inputs of the frequency dividers, etc., and performs phase comparisons multiple times during one period of the reference signal to shorten the lock-up time.

However, this PLL circuit consumes large electricity since it has a plurality of (four) frequency dividers. To perform phase comparisons eight times during one period of the reference signal so that the lock-up time is further shortened, eight frequency dividers are required, which increases the power consumption downhill. In addition, there is a problem that the PLL circuit is large in dimension, costly, and difficult to implement in an LSI, since it has a plurality of frequency dividers and a plurality of phase comparators each of which requires a relatively large layout space.

The PLL circuit disclosed in Japanese Unexamined Patent Publication 11-20405 includes a reference oscillator, a fixed frequency divider dividing an output of the reference oscillator, a reference signal generating means for dividing an output of the fixed frequency divider to generate a plurality of reference signals having mutually differing phases, a voltage-controlled oscillator, a plurality of variable frequency dividers each dividing an output of the voltage-controlled oscillator, a plurality of phase comparators comparing phases between the reference signals and outputs of the variable frequency dividers.

In this PLL circuit, the frequency of the reference signals supplied to the phase comparators must match a channel spacing frequency, or a frequency spacing of the signals to be produced by this PLL circuit. For example, in a case where this PLL circuit has four phase comparators and four variable frequency dividers when the oscillation frequency of the reference oscillator is 13 MHz and the channel spacing frequency is 200 kHz, the fixed frequency divider must supply the reference signal generating means with a signal having a frequency of 200 kHz×4=800 kHz, since the frequency of the reference signals supplied to the phase comparators should be 200 kHz. That is, in this case, the frequency-division ratio of the fixed frequency divider has to be 13 MHz/800 kHz=16.25 (=16+1/4). It is difficult to manufacture such a frequency divider having a frequency-division ratio that includes a decimal fraction of 1/4, and will be extremely expensive even if it is manufactured.

As described above, the PLL circuit disclosed in Japanese Unexamined Patent Publication 11-20405 has, in addition to the disadvantage of the PLL circuit disclosed in Japanese Unexamined Patent Publication 10-135822, the disadvantage that it is difficult to adapt to many and various reference oscillators and channel spacing frequencies.

A first object of the present invention is to provide a PLL circuit which has a short lock-up time and a small electric power consumption, is easy to implement in an LSI, and is low in manufacturing cost.

A second object of the present invention is to provide a PLL circuit which has a short lock-up time and a small electric power consumption, is easy to implement in an LSI, and is adaptable to any reference oscillator and channel spacing frequency.

DISCLOSURE OF THE INVENTION

The first object is achieved by PLL circuit including:
- a generating means (3) for generating a plurality of reference signals (fR1 to fR8) having mutually differing phases;
- a main frequency divider (30) dividing an output signal (fVCO) of a voltage-controlled oscillator (29) by a frequency-division ratio of N1;
- an auxiliary frequency divider (31) dividing an output (fV') of the main frequency divider (30) by a frequency-division ratio of N2;
- a distribution circuit (32) distributing an output (Q1a, Q2a, Q3a) of the auxiliary frequency divider (31) as a plurality of feedback signals (fV1 to fV8); and
- a phase comparing unit (12 to 19) comparing the reference signals with the feedback signals to output error signals (ER1 to ER8);

each of the main frequency divider and the auxiliary frequency divider being comprised of a variable frequency divider or a counter.

The first object is achieved also by PLL circuit including:
a generating means (3a) for generating a plurality of reference signals (FR1a to FR8a) having mutually differing phases;

a main frequency divider (30a) dividing an output signal (VO) of a voltage-controlled oscillator (29a) by a frequency-division ratio of N1;

an auxiliary frequency divider (31a) dividing an output (FV') of the main frequency divider by a frequency-division ratio of N2;

a distributing unit (32a) distributing an output of the auxiliary frequency divider as a plurality of feedback signals (FV1 to FV8); and a phase comparing unit (12a) comparing phases between the reference signal (FR1a to FR8a) with the feedback signal (FV1 to FV8) to output a plurality of phase comparison signals (U, D);

the phase comparing unit 812a) being comprised of a single phase comparator.

The first object is achieved also by a PLL circuit including:

a first frequency divider (71) dividing an output (fR) of a reference oscillator (4b) to output a reference signal (FR);

a second frequency divider (72) dividing an output signal (VO) of a voltage-controlled oscillator (29b) to output a feedback signal (FV);

a phase comparator comparing phases between the reference signal (FR) with the feedback signal (FV);

wherein first frequency divider (71) performs frequency division by a small frequency-division ratio during start-up, and performs frequency division by a large frequency-division ratio near lock.

The second object is achieved by a PLL circuit including:

a first fixed frequency divider (103) dividing an output signal of a reference oscillator (102) by a frequency-division ratio of N1 (N1 being an integer);

a second fixed frequency divider (105) dividing an intermediate signal output from a first voltage-controlled oscillator (104) by a frequency-division ratio of N2 (N2 being an integer);

a first phase comparator (103) comparing phases between an output of the first fixed frequency divider (103) and an output of the second fixed frequency divider (105) to output a phase comparison signal to the first voltage-controlled oscillator (104); and a converter (110) dividing the intermediate signal (FR) by a frequency-division ratio of N3 (N3 being an integer) to output a plurality of reference signals (FR1 to FR4) having different phases.

The second object is also achieved by a PLL circuit including: a first fixed frequency divider (203) dividing an output of a reference oscillator (202) by a frequency-division ratio of N+1/2 (N being an integer);

a second frequency divider (204) dividing an output of the first frequency divider (203) by two;

a third fixed frequency divider (206) dividing an intermediate signal (FR) output from a first voltage-controlled oscillator (205) by a frequency-division ratio of N1 (N1 being an integer);

a first phase comparator (207) comparing phases between an output of the second fixed frequency divider (204) and an output of the third fixed frequency divider (206) to output a phase comparison signal to the first voltage-controlled oscillator (207); and a converter (110) dividing the intermediate signal (FR) by a frequency-division ratio of N2 (N2 being an integer) to output a plurality of reference signals (FR1 to FR4) having different phases.

The second object is achieved also by a PLL circuit including:

a first fixed frequency divider (303) dividing an output of a reference oscillator (302) by a frequency-division ratio of N1 (N1 being an integer);

a second fixed frequency divider (305) dividing an output signal (FA) of a first voltage-controlled oscillator (304) by a frequency-division ratio of N2 (N2 being an integer);

a first phase comparator (306) comparing phases between outputs of the first and second fixed frequency dividers;

a third fixed frequency divider (309) dividing the output signal (FA) by a frequency-division ratio of N3 (N3 being an integer); and a converter (110) dividing an output (FR) of the third fixed frequency divider (309) by a frequency-division ratio of N4 (N4 being an integer) to output a plurality of reference signals (FR1 to FR4) having different phases.

The second object is also achieved by a PLL circuit including:

a first fixed frequency divider (403) dividing an output of a reference oscillator (402) by a frequency-division ratio of N+1/2 (N being an integer);

a second fixed frequency divider (405) dividing an output signal (FR) of a first voltage-controlled oscillator (404) by a frequency-division ratio of N1 (N1 being an integer);

a first phase comparator (406) comparing phases between outputs of the first and second fixed frequency dividers; and a converter (110) dividing the output signal (FR) by a frequency-division ratio of N2 (N2 being an integer) to output a plurality of reference signals (FR1 to FR4) having different phases.

BEST MODES OF PRACTICING THE INVENTION

A PLL circuit 1 according to a first embodiment of the invention will be described with reference to FIGS. 1 and 2.

Figure 1:
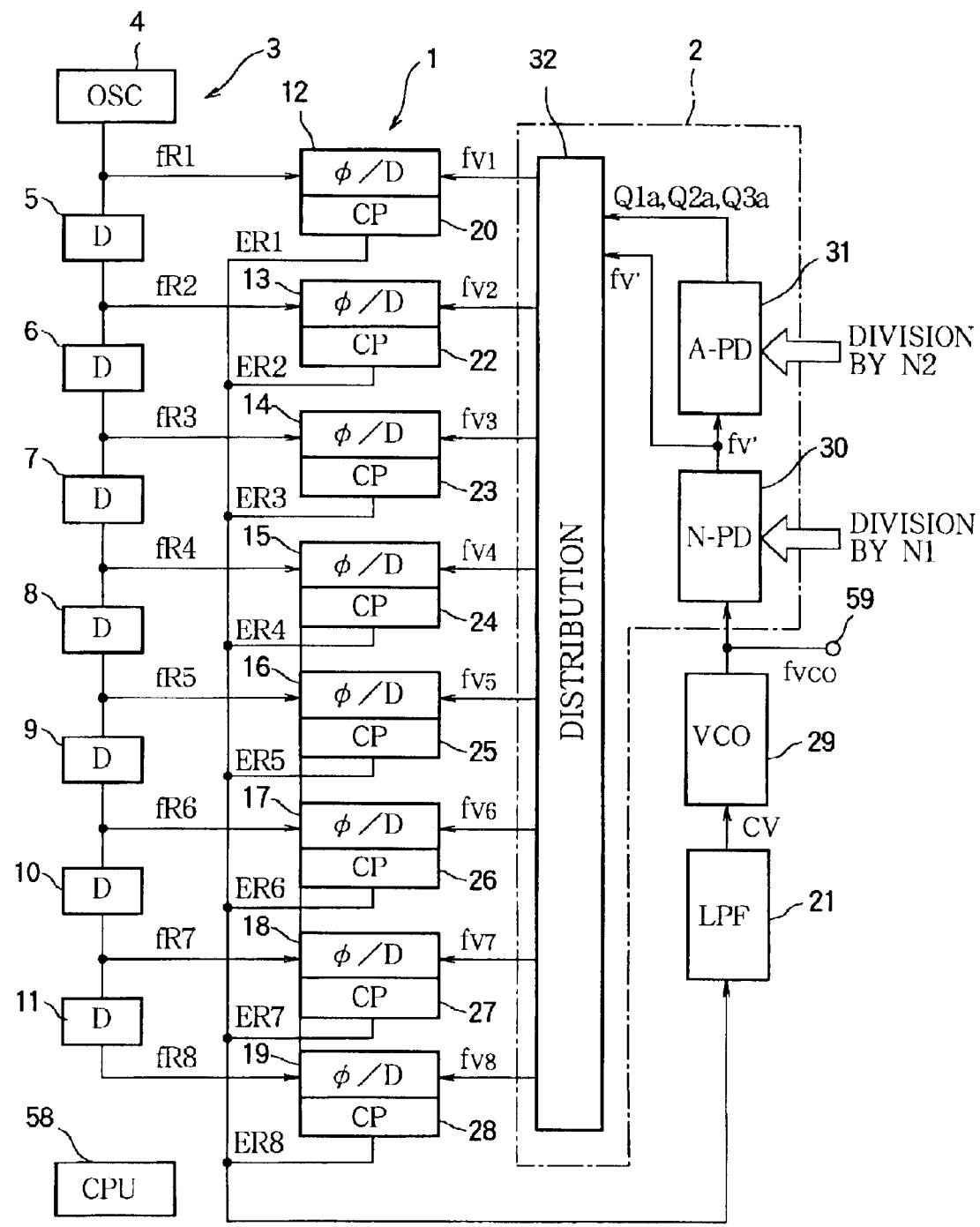
FIG. 1 is a block diagram of a PLL circuit 1 according to a first embodiment of the invention.
Figure 2:
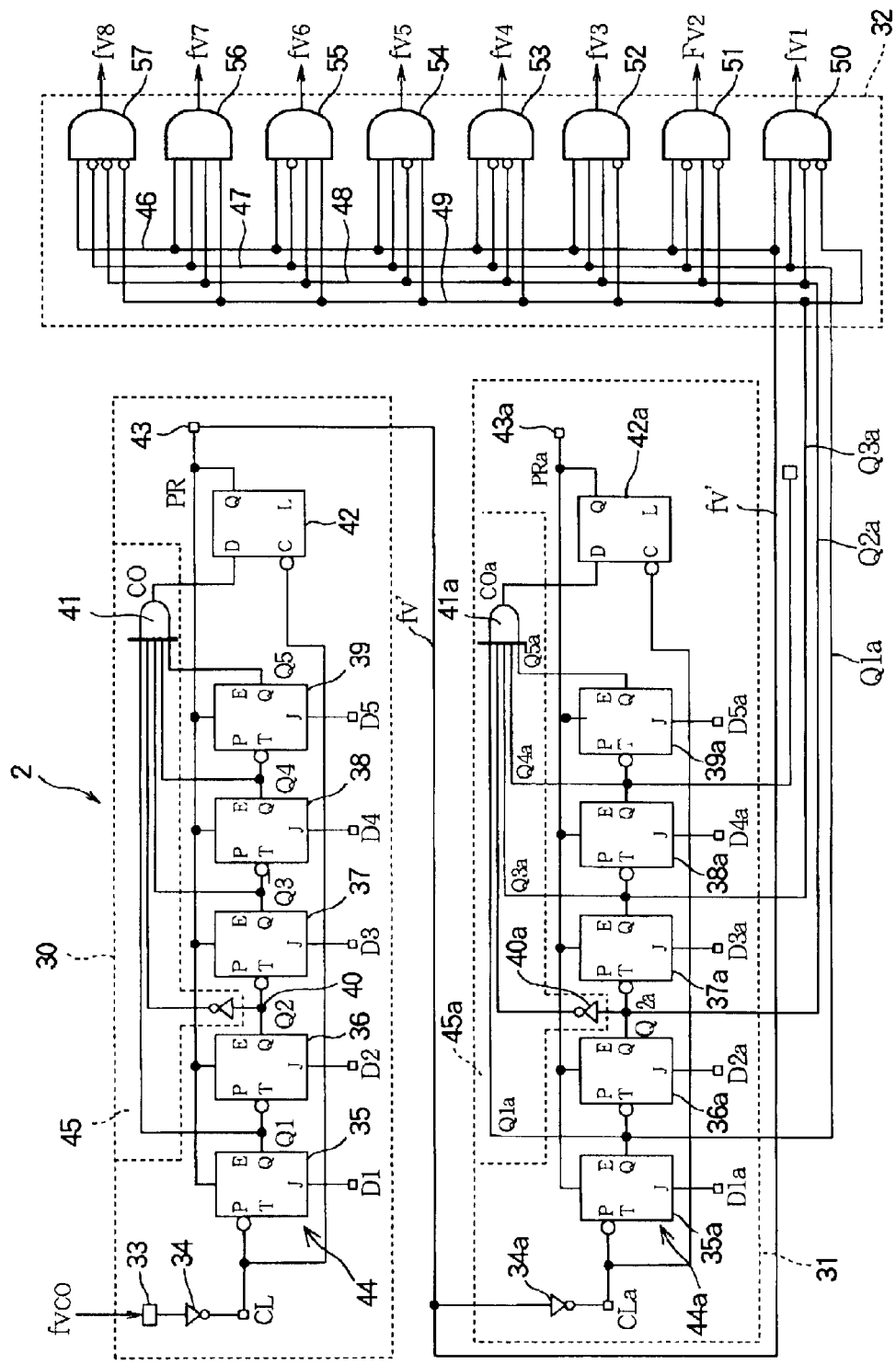
FIG. 2 is a block diagram of a frequency-dividing unit 2 within the PLL circuit 1.

FIG. 1 is a block diagram of the PLL circuit 1, and FIG. 2 is a detailed block diagram of a frequency-dividing unit 2 within the PLL circuit 1.

In these figures, a generating means 3 is comprised of a reference oscillator 4, seven delay circuits 5, 6, 7, 8, 9, 10, 11 connected in series, and so on. The reference oscillator 4 outputs a reference signal fR1 having a frequency of 10 kHz, for example. A waveform of the reference signal fR1 is shown in the timing diagram of FIG. 4. The reference signal fR1 rises at timings T1 and T9. The reference signal fR1 is supplied to one input of a phase comparator 12.

The delay circuit 5 delays the reference signal fR1 by 1/8 period (Tref/8), and supplies it to a phase comparator 13 as a reference signal fR2. The delay circuit 6 delays the reference signal fR1 by 2/8 period, and outputs it to a phase comparator 14 as a reference signal fR3.

The delay circuit 7 delays the reference signal fR1 by 3/8 period, and outputs it to a phase comparator 15 as a reference signal fR4. The delay circuit 8 delays the reference signal fR1 by 4/8 period, and outputs it to a phase comparator 16 as a reference signal fR5.

The delay circuit 9 delays the reference signal fR1 by 5/8 period, and outputs it to a phase comparator 17 as a reference signal fR6. The delay circuit 10 delays the reference signal fR1 by 6/8 period, and outputs it to a phase comparator 18 as a reference signal fR7. The delay circuit 11 delays the reference signal fR1 by 7/8 period, and outputs it to a phase comparator 19 as a reference signal fR8.

In this way, the generating means 3 generates a plurality of the reference signals fR1 to fR8 having mutually differing phases. The timings T1, T2, T3, T4, T5, T6, T7, T8 represent the moments at which the reference signals fR1, fR2, fR3, fR4, fR5, fR6, fR7, fR8 rise respectively (see FIG. 4).

Feedback signals fV1, fV2, fV3, fV4, fV5, fV6, fV7, fV8 (to be explained later) are supplied to the other inputs of the phase comparators 12, 13, 14, 15, 16, 17, 18, 19.

The phase comparator 12 compares phases between the feedback signal fV1 and the reference signal fR1, and as the result, outputs a pump-up signal or a pump-down signal to a charge pump 20. The charge pump 20 outputs an err signal ER1 to a low-pass filter 21 in response to the pump-up signal or the pump-down signal.

Likewise, the phase comparators 13, 14, 15, 16, 17, 18, 19 compare phases between the feedback signals fV2, fV3, fV4, fV5, fV6, fV7, fV8 and the reference signals fR2, fR3, fR4, fR5, fR6, fR7, fR8 respectively.

As results of the phase comparisons, the phase comparators 13, 14, 15, 16, 17, 18, 19 output pump-up signals or pump-down signals to the charge pumps 22, 23, 24, 25, 26, 27, 28. The charge pumps 22, 23, 24, 25, 26, 27, 28 output error signals ER2, ER3, ER4, ER5, ER6, ER7, ER8 to the low-pass filter 21 in response to the pump-up or pump-down signals.

The low-pass filter 21 outputs a control voltage CV to a voltage-controlled oscillator 29 in response to the error signals ER1 to ER8. The voltage-controlled oscillator 29 generates an output signal fVCO in response to the control voltage CV.

A frequency dividing unit 2 includes a main frequency divider 30, an auxiliary frequency divider 31, and a distribution circuit 32. The main frequency divider 30 divides the output signal fVCO of the voltage-controlled oscillator 29 by a frequency-division ratio N1, and outputs an intermediate signal fV'.

The auxiliary frequency divider 31 divides the output (the intermediate signal fV') of the main frequency divider 30 by a frequency-division ratio N2, and outputs signals Q1a, Q2a, Q3a. The distribution circuit 32 produces a plurality of the feedback signals fV1, fV2, fV3, fV4, fV5, fV6, fV7, fV8 from the signals Q1a, Q2a, Q3a, fV, and outputs them to the phase comparators 12 to 19.

The main frequency divider 30 includes an input terminal 33, an inverter 34, toggle flip-flops 35, 36, 37, 38, 39, an inverter 40, an AND gate 41, a D-type flip-flop 42, and an output terminal 43.

The inverter 34 is connected between the input terminal 33 and the toggle flip-flop 35. The toggle flip-flops 35, 36, 37, 38, 39 each provided with input-inverting function are connected in series. The J-terminals of the toggle flip-flops 35 to 39 are connected to input terminals D1, D2, D3, D4, D5 respectively.

The toggle flip-flops 35 to 39 form a counter 44. The counter 44 receives an inverted version of the output signal fVCO as a clock pulse CL, performs down count depending on the frequency-division ratio N1 supplied through the input terminals D1 to D5, and is reset each time a signal PR is applied to PE terminals.

The inverter 40 and the AND gate 41A form a coincidence circuit 45. Output terminals Q of the toggle flip-flops 35, 37, 38, 39 are connected to the input terminals of the AND gate 41 respectively. The output terminal Q of the toggle flip-flop 36 is connected to the input terminal of the AND gate 41 through the inverter 40. The coincidence circuit 45 generates a detection signal CO which goes high when the output of the counter 44 becomes "2".

The D-type flip-flop 42 provided with input-inverting function receives the inverted version of the output signal fVCO as a clock pulse, and outputs, through its terminal Q, the signal PR that is the detection signal CO from the coincidence circuit 45 delayed by one period of the output signal fVCO. Thus the signal PR (or the intermediate signal fV') is output from the output terminal 43.

As explained above, the frequency-division ratio N1 is determined when a given set of signals are applied to the input terminals D1, D2, D3, D4, D5, and the intermediate signal fV', which is the output signal fVCO with its frequency divided by N1, is output from the output terminal 43.

The auxiliary frequency divider 31 includes an inverter 34a, toggle flip-flops 35a, 36a, 37a, 38a, 39a, an inverter 40a, an AND gate 41a, a D-type flip-flop 42a, and an output terminal 43a.

The inverter 34a is connected between the output terminal 43 of the main frequency divider 30 and the toggle flip-flop 35a. The toggle flip-flops 35a, 36a, 37a, 38a, 39a each provided with input-inverting function are connected in series. The J-terminals of the toggle flip-flops 35a to 39a are connected to input terminals D1a, D2a, D3a, D4a, D5a respectively.

The toggle flip-flops 35a to 39a form a counter 44a. The counter 44a receives an inverted version of the intermediate signal fV' as a clock pulse CLa, performs down count depending on the frequency-division ratio N2 supplied through the input terminals D1a to D5a, and is reset each time a signal PRa is applied to PE terminals.

The inverter 40a and the AND gate 41a form a coincidence circuit 45a. The output terminals Q of the toggle flip-flops 35a, 37a, 38a, 39a are connected to the input terminals of the AND gate 41a respectively. The output terminal Q of the toggle flip-flop 36a is connected to the input terminal of the AND gate 41a through the inverter 40a. The coincidence circuit 45a generates a detection signal COa which goes high when the output of the counter 44a becomes "2".

The D-type flip-flop 42a provided with input-inverting function receives the inverted version of the intermediate signal fV' as a clock pulse, and outputs the signal PRa that is the detection signal COa from the coincidence circuit 45a delayed by one period of the intermediate signal fV7.

The frequency-division ratio N2 is determined when a given set of signals are applied to the input terminal D1a, D2a, D3a, D4a, D5a. If N2 is set to 8, for example, the signal Q1a, which is intermediate signal fV' with its frequency divided by 2, is output from the output terminal Q of the toggle flip-flop 35a.

The signal Q2a, which is the intermediate signal fV' with its frequency divided by 4, is output from the output terminal Q of toggle flip-flop 36a. The signal Q3a, which is the intermediate signal fV' with its frequency divided by 8, is output from the output terminal Q of toggle flip-flop 37a.

The distribution circuit 32 serving as a decoder includes conductors 46, 47, 48, 49 and AND gates 50, 51, 52, 53, 54, 55, 56, 57. The conductors 46, 47, 48, 49 carry the intermediate signal fV' and the signals Q1a, Q2a, Q3a. The conductors 46, 47, 48, 49 are connected to the first terminals, second terminals, third terminals, and fourth terminals of the AND gates 50 to 57 respectively.

The AND gate 50 outputs, as the feedback signal fV1, an AND of the signals fV', Q1a, Q2a-inverted, and Q3a-inverted. The AND gate 51 outputs, as the feedback signal fV2, an AND of the intermediate signal fV', an inverted version of the signal Q1a, the signal Q2a, and an inverted version of the signal Q3a. The AND gate 52 outputs, as the feedback signal fV3, an AND of the signals fV', Q1a, Q2a, and Q3a-inverted. The AND gate 53 outputs, as the feedback signal fV4, an AND of the signals fV', Q1a-inverted, Q2a-inverted, and Q3a.

The AND gate 54 outputs, as the feedback signal fV5, an AND of the signals fV', Q1a, Q2a-inverted, and Q3a. The AND gate 55 outputs, as the feedback signal fV6, an AND of the signals fV', Q1a-inverted, Q2a, and Q3a. The AND gate 56 outputs, as the feedback signal fV7, an AND of the signals fV', Q1a, Q2a, and Q3a. The AND gate 57 outputs, as the feedback signal fV8, an AND of the intermediate signal fV', an inverted version of the signal Q1a, an inverted version of the signal Q2a, and an inverted version of the signal Q3a. This PLL circuit 1 is constituted by the above-explained components.

Figure 3:
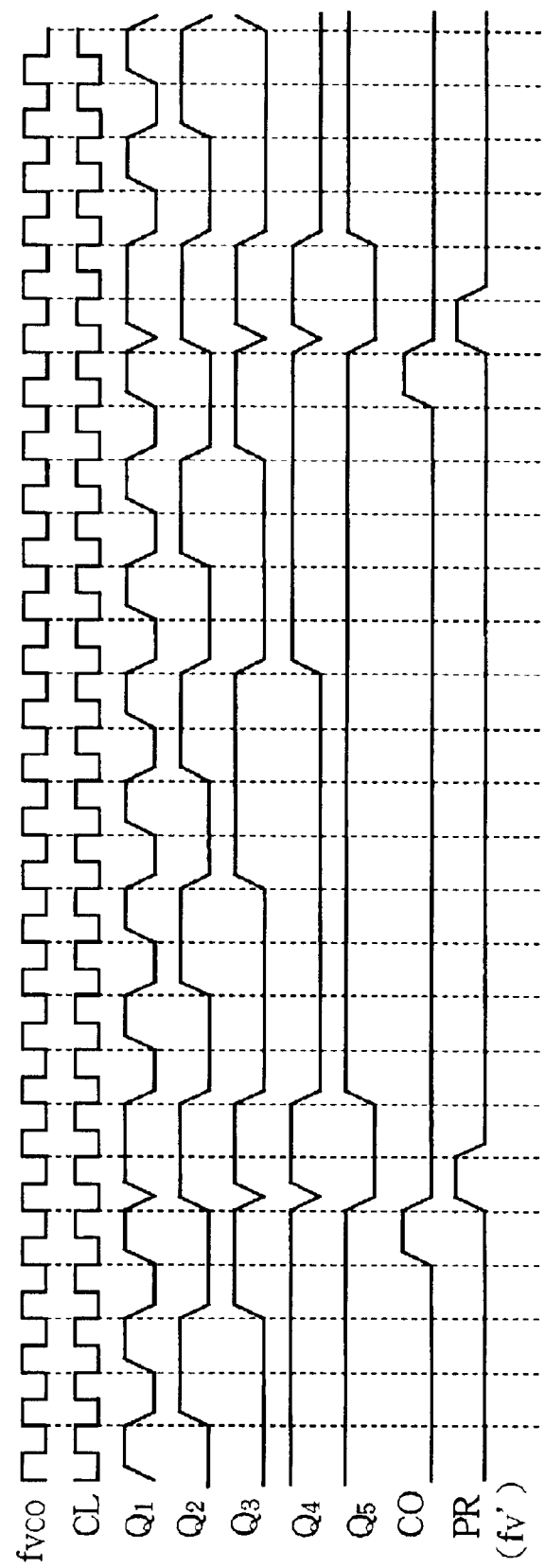
FIG. 3 is a timing diagram of signals Q1 to Q5 used in the PLL circuit 1.
Figure 4:
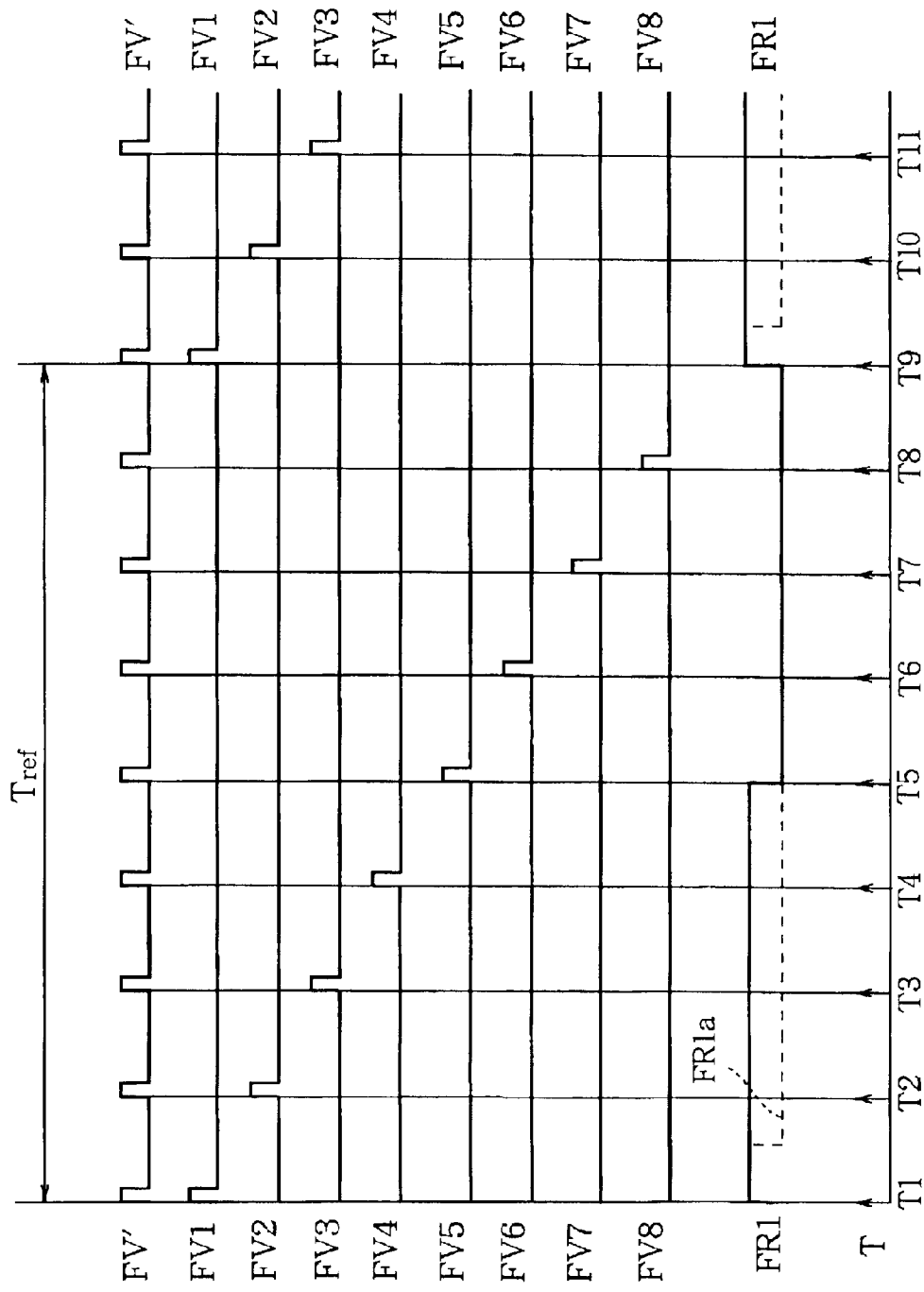
FIG. 4 is a timing diagram of signals FV1 to FV8 used in the PLL circuit 1.

The operation of this PLL circuit 1 will now be explained with reference to FIG. 1 to FIG. 4. FIG. 3 is a timing diagram of the signals fVCO, CL, Q1, Q2, Q3, Q4, Q5, CO, PR, and FIG. 4 is a timing diagram of the signals fV', fV1 to fV8.

Suppose that 1280 kHz is input into a control unit 58 as a set frequency of the output signal fVCO through input means (not shown). Then the control unit 58 calculates a set frequency-division ratio N on the output signal fVCO as N=1280 kHz/10 kHz=128, since the frequency of the reference signal is 10 kHz.

Following this calculation, the control unit 58 places the frequency-division ratio N1 of the main frequency divider 30 at 16, and the frequency-division ratio N2 of the auxiliary frequency divider 31 at 8. That is, the control unit 58 makes the product of the frequency-division ratio N1 and the frequency-division ratio N2 match the set frequency-division ratio N on the output signal fVCO.

In accordance with the determination of the frequency-division ratio of N1=16, the input terminals D1, D2, D3, D4, D5 of the main frequency divider 30 are applied with "high-level", "high-level", "high-level", "high-level", and "low-level" signals respectively. As explained above, the main frequency divider 30 functions as a variable frequency divider or a counter capable of dividing the output signal fVCO by the variable (programmable) frequency-division ratio N1 by receiving a given set of signals (high-level or low-level signals) at its input terminals D1 to D5.

The clock pulse CL has a waveform as shown by CL in FIG. 3 since it is an inverted version of the output signal fVCO. As shown in FIG. 3, the signal Q1 has a period twice as long as that of the output signal fVCO, and lags one period behind the output signal fVCO. The signal Q2 has a period twice as long as that of the signal Q1, and lags behind the signal Q1 by a certain phase angle.

The signal Q3 has a period twice as long as that of the signal Q2, and lags behind the signal Q2 by a certain phase angle. The signal Q4 has a period twice as long as that of the signal Q3, and lags behind the signal Q3 by a certain phase angle. The signal Q5 has a period twice as long as that of the signal Q4, and lags behind the signal Q4 by a certain phase angle.

The AND gate 41 outputs, as the signal CO, an AND of the signals Q1, Q2-inverted, Q3, Q4, and Q5 (see CO in FIG. 3). The signal CO is delayed by one period of the output signal fVCO, and output as the signal PR (fV'). Each time the terminals PE of the toggle flip-flops 35 to 39 are applied with the signal PR, the signals Q1 to Q5 are reset. In this way, the main frequency divider 30 outputs the intermediate signal fV' which is the output signal fVCO with its frequency divided by N1 (=16).

The intermediate signal fV' is input to the toggle flip-flop 35a through the inverter 34a of the auxiliary frequency divider 31. In accordance with the determination of the frequency-division ratio of N2=8, the input terminals D1a, D2a, D3a, D4a, D5a of the auxiliary frequency divider 31 are applied with "high-level", "high-level", "high-level", "low-level", and "high-level" signals respectively.

As explained above, the auxiliary frequency divider 31 functions as a variable frequency divider or a counter capable of dividing the intermediate signal fV' by the variable (programmable) frequency-division ratio N2 by receiving a given set of signals (high level or low level signals) at its input terminals D1a to D5a.

As in the case of FIG. 3, the signal Q1a has a period twice as long as that of the intermediate signal fV', and lags behind the intermediate signal fV' by a certain phase angle. The signal Q2a has a period twice as long as that of the signal Q1a, and lags behind the signal Q1a by a certain phase angle. The signal Q3a has a period twice as long as that of the signal Q2a, and lags behind the signal Q2a by a certain phase angle. The signal Q4a has a period twice as long as that of the signal Q3a, and lags behind the signal Q3a by a certain phase angle. The signal Q5a has a period twice as long as that of the signal Q4a, and lags behind the signal Q4a by a certain phase angle.

The AND gate 41a outputs, as the signal COa, an AND of the signals Q1a, Q2a-inverted, Q3a, Q4a, and Q5a. The D-type flip-flop 42 outputs the signal PRa upon receiving the signal COa. Each time the terminals PE of the toggle flip-flops 35a to 39a are applied with the signal PRa, the signals Q1a to Q5a are reset.

In this way, the auxiliary frequency divider 31 outputs the signal Q1a which is the intermediate signal fV' with its frequency divided by 2, the signal Q2a which is the intermediate signal fV' with its frequency divided by 4, and the signal Q3a which is the intermediate signal fV' with its frequency divided by 8 (N2=8) to the distribution circuit 32. In the distribution circuit 32, the intermediate signal fV' and the signals Q1a, Q2a, Q3a are applied to the input terminals of the AND gates 50 to 57 by way of the conductors 46, 47, 48, 49.

The AND gate 50 outputs, as the feedback signal fV1, an AND of the signals fV', Q1a, Q2a-inverted, and Q3a-inverted. As shown in FIG. 4, this feedback signal fV1 is in phase with the intermediate signal fV' (no phase difference), and has a period eight times as long as that of the intermediate signal fV'.

The AND gate 51 outputs, as the feedback signal fV2, an AND of the signals fV', Q1a-inverted, Q2a, and Q3a-inverted. Accordingly, the feedback signal fV2 has a period eight times as long as that of the intermediate signal fV', and lags one period behind the feedback signal fV1.

Likewise, the feedback signals fV3, fV4, fV5, fV6, fV7, fV8 have a period eight times as long as that of the intermediate signal fV', and lag two periods, three periods, four periods, five periods, six periods, and seven periods behind the feedback signal fV1 respectively.

The frequency of the reference signal fR1 is obtained as follows. Since fR1=fVCO/N, fVCO=N1×fV' and N=N1×N2, fR1=(N1×fV')/(N1×N2)=fV'/N2=fV'/8.

That is, the reference signal fR1 is the intermediate signal fV' with its frequency divided by 8. Accordingly, the reference signal fR1 has such a period as shown by Tref shown in FIG. 4. Thus the rise timings of the feedback signals fV1, fV2, fV3, fV4, fV5, fV6, fV7, fV8 coincide with the rise timings T1, T2, T3, T4, T5, T6, T7, T8 of the reference signals fR1 to fR8.

Accordingly, the phase comparators 12, 13, 14, 15, 16, 17, 18, 19 compare phases between the feedback signals fV1, fV2, fV3, fV4, fV5, fV6, fV7, fV8 and the reference signals fR1, fR2, fR3, fR4, fR5, fR6, fR7, fR8 at the timings T1, T2, T3, T4, T5, T6, T7, T8 respectively.

In consequence, the phase comparisons are performed eight times during one period (Tref) of the reference signal fR1, so the lock-up time (the time until synchronization with the output signal fVCO is reached) is shortened to approximately 1/8 that of a conventional phase comparator of the single-stage type.

As results of the phase comparisons, the phase comparators 12 to 19 output the pump-up signals or the pump-down signals to the charge pumps 20 to 28. The charge pumps 20 to 28 each output the error signals ER1 to ER8 to the low-pass filter 21 in response to the pump-up or pump-down signals.

The low-pass filter 21 outputs the control voltage CV to the voltage-controlled oscillator 29 in response to the error signals ER1 to ER8. The voltage-controlled oscillator 29 generates then output signal fVCO in response to the control voltage CV. Through repetition of the above operation in the loop, the PLL circuit eventually delivers the output signal fVCO having the set frequency of 1280 kHz from an output terminal 59 connected to the output of the voltage-controlled oscillator 29. This completes the description of the operation of the PLL circuit 1.

In the PLL circuit 1, incidentally, the frequency-division ratio N2 of the auxiliary frequency divider 31 is set at or below the number of the phase comparators 12 to 19 that compare phases between the reference signals fR1 to fR8 and the feedback signals fV1 to fV8.

For another example, suppose that 320 kHz is input through the input means to the control unit 58 as a set frequency of the output signal fVCO. The control unit 58 calculates a set frequency-division ratio N on the output signal fVCO as N=320 kHz/10 kHz=32.

For a set frequency-division ratio of N=32, the control unit 58 places the frequency-division ratio N of the main divider 30 at 16, and places the frequency-division ratio N2 of the auxiliary divider 31 at 2. Thus for the comparatively small frequency-division ratio setting of N=32, the control unit 58 chooses a comparatively small value (2, for example) for the frequency-division ratio N2 of the auxiliary frequency divider 31.

By reducing the frequency-division ratio N2 in this way, the amount of power consumed by the auxiliary divider 31 can be reduced. As described above, the frequency-division ratio N2 is placed at or below the number of the phase comparators 12 to 19 (8 in this embodiment). For example, the frequency-division ratio N2 is selected from the range of integers from one to eight.

As described above, an appropriate value is selected for the frequency-division ratio N2 depending on the set size of the frequency-division ratio N1, the desired lock-up time, the desired amount of power consumption, and so on. The auxiliary divider 31 is formed from a programmable divider or counter, so an appropriate frequency-division ratio N2 can be selected as explained above.

For another example, suppose that 1290 kHz is input through the input means to the control unit 58 as a set frequency of the output signal fVCO. In this case, the control unit 58 calculates N=129 as the set frequency-division ratio N on the output signal fVCO.

For the set frequency-division ratio of N=129, the control unit 58 places the frequency-division ratio N1 of the main frequency divider 30 at 16, and places the frequency-division ratio N2 of the auxiliary frequency divider 31 at 8. As a result, the PLL circuit 1 delivers the output signal fVCO having a frequency corresponding to the set frequency-division ratio of N=128 from the output terminal 59.

If AND gates that take the ANDs of the pump-up signals and pump-down signals output from the phase comparators 12 to 19 are provided in correspondence to the phase comparators 12 to 19, and their outputs are sent to the control unit 58, the control unit 58 can detect that the output signal fVCO has reached a frequency corresponding to the frequency-division ratio of N=128.

After making this detection, the control unit 58 stops the operation of the auxiliary frequency divider 31, and simultaneously alters the frequency-division ratio of the main divider 30 to N1=129. Accordingly, the main divider 30 outputs the intermediate signal fV' which is the output signal fVCO with its frequency divided by the frequency-division ratio of N1=129 to the distribution circuit 32. Thus the PLL circuit 1 delivers the output signal fVCO having the set frequency of 1290 kHz corresponding to the frequency-division ratio of N=129 from the output terminal 59.

In this way, for a given frequency-division ratio setting (N=129, for example), the output signal fVCO is divided by use of the main frequency divider 30 and the auxiliary frequency divider 31 at first, and then it is divided by use of the main frequency divider 30 alone.

With this configuration, even if the set frequency-division ratio N (N=129, for example) cannot be expressed as the product of the frequency-division ratio N1 of the main frequency divider 30 and the frequency-division ratio N2 of the auxiliary frequency divider 31, the output signal fVCO having a frequency corresponding to the set frequency-division ratio N can be output.

Moreover, if the set frequency-division ratio N (N=128, for example) can be expressed as the product of the frequency-division ratio N1 (N1=16, for example) of the main frequency divider 30 and the frequency-division ratio N2 (N2=8, for example) of the auxiliary frequency divider 31, it is permissible to divide the output signal fVCO by the main frequency divider 30 and the auxiliary frequency divider 31 at first, and then divides it by the main frequency divider 30 alone.

Thus the lock-up time is shortened by performing the frequency division by use of the main frequency divider 30 and the auxiliary frequency divider 31 during start-up. Furthermore, the amount of power consumed can be reduced by stopping the operation of the auxiliary frequency divider 31 and having only the main frequency divider 30 perform the operation.

Figure 5:
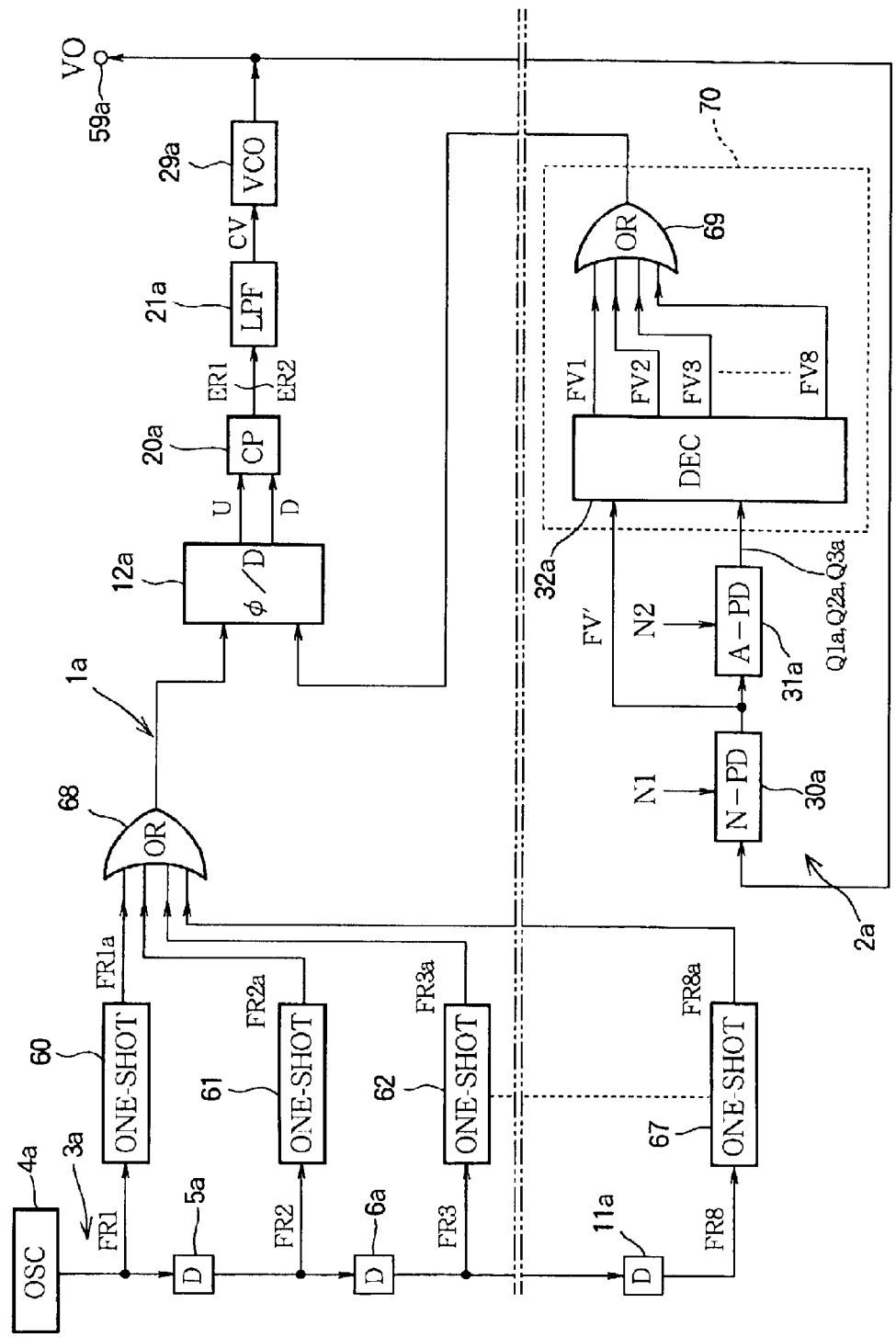
FIG. 5 is a block diagram of a PLL circuit 1a according to a second embodiment of the invention.

A PLL circuit 1a according to a second embodiment of the invention will be described based on a block diagram shown in FIG. 5. In FIG. 5, a generating means 3a is comprised of a reference oscillator 4a, seven delay circuits 5a to 11a connected in series, eight one-shot circuits 60 to 67, and so on.

The reference oscillator 4a, that has about the same structure as the reference oscillator 4, outputs a governing signal FR1 of 10 kHz, for example. A waveform of the governing signal FR1 is shown in the timing diagram of FIG. 4. The governing signal FR1 is input into the one-shot circuit 60, and converted into a reference signal FR1a (see FIG. 4) of the one-shot type remaining at the high level only for a certain time after transition from the low level to the high level. The reference signal FR1a is input into a first OR gate 68.

The delay circuit 5a delays the governing signal FR1 by 1/8 period. A resultant governing signal FR2 is converted into a reference signal FR2a of the one-shot type by the one-shot circuit 61. This reference signal FR2a of the one-shot type is input into the first OR gate 68.

The delay circuit 6a delays the governing signal FR1 by 2/8 period. A resultant governing signal FR3 is converted into a reference signal FR3a of the one-shot type by the one-shot circuit 62. This reference signal FR3a of the one-shot type is input into the first OR gate 68.

Likewise, the delay circuit 11a delays the governing signal FRI by 7/8 period. A resultant governing signal FR8 is converted into a reference signal FR8a of the one-shot type by the one-shot circuit 67. This reference signal FR8a of the one-shot type is input into the first OR gate 68.

In this way, the generating means 3a generates a plurality of the reference signals FR1a to FR8a having mutually differing phases. The timings T1, T2, T3, T4, T5, T6, T7, T8 represent the moments at which the reference signals FR1a, FR2a, FR3a, FR4a, FR5a, FR6a, FR7a, FR8a rise respectively (see FIG. 4).

Feedback signals FV1, FV2, FV3, FV4, FV5, FV6, FV7, FV8 (to be explained later) are input into a second OR gate 69.

A phase comparator 12a compares phases between the output of the first OR gate 68 and the output of the second OR gate 69, and outputs a phase comparison signal U or D.

The first OR gate 68 outputs the reference signals FR1a to FR8a in succession to the phase comparator 12a, while the second OR gate 69 outputs the feedback signals FV1 to FV8 in succession to the phase comparator 12a.

Thus the phase comparator 12a compares phases between the reference signal FR1a and the feedback signal FV1, and outputs a phase comparison signal U1 or D1 to a charge pump 20a. The phase comparator 12a compares phases between the reference signal FR2a and the feedback signal FV2, and outputs a phase comparison signal U2 or D2 to the charge pump 20a. Likewise, the phase comparator 12a compares phases between the reference signal FR8a and the feedback signal FV8, and outputs a phase comparison signal U8 or D8 to the charge pump 20a.

In this way, the phase comparator 12a compares phases between the reference signals FR1a to FR8a and the feedback signals FV1 to FV8, and outputs the phase comparison signals U1 to U8 or D1 to D8 to the charge pump 20a.

The charge pump 20a outputs error signals ER1 to ER8 to a low-pass filter 21a in response to the phase comparison signals U1 to U8 or D1 to D8.

The low-pass filter 21a outputs a control voltage CV to a voltage-controlled oscillator 29a in response to the error signals ER1 to ER8. The voltage-controlled oscillator 29a delivers an output signal VO in response to the control voltage CV.

A frequency dividing unit 2a is comprised of a main frequency divider 30a, an auxiliary frequency divider 31a, a distribution circuit 70, and so on. The main frequency divider 30a, that has an about the same structure as the main frequency divider 30 shown in FIG. 1, divides the output signal VO of the voltage-controlled oscillator 29a by a frequency-division ratio N1 and outputs an intermediate signal FV'.

The auxiliary frequency divider 31, that has an about the same structure as the auxiliary frequency divider 31 shown in FIG. 1, divides the output (the intermediate signal FV') of the main frequency divider 30a by a frequency-division ratio N2, and outputs signals Q1a, Q2a, Q3a.

The distribution circuit 70 is formed from a distribution circuit 32a and the second OR gate 69. The distribution circuit 32a, that has an about the same structure as the distribution circuit 32 shown in FIG. 1, converts the output FV' of the main frequency divider 30a and the output (the signals Q1a, Q2a, Q3a) of the auxiliary frequency divider 32a into a plurality of the feedback signals FV1 to FV8 to be distributed.

The second OR gate 69 outputs the feedback signals FV1 to FV8 one by one to the phase comparator 12a.

As explained above, the first OR gate 68 outputs the reference signals FR1a to FR8a one by one, and the second OR gate 69 outputs the feedback signals FV1 to FV8 one by one. The phase comparator 12a has only to compare one of the reference signals and corresponding one of the feedback signals (the reference signal FR1a and the feedback signal FV1, for example) at a time, so the one phase comparator 12a is good enough for performing phase comparisons. This PLL circuit 1a is constituted by the above-explained components.

The operation of this PLL circuit 1a will be explained with reference to FIG. 5. Suppose that 1280 kHz is input through input means (not shown) to a control unit (not shown) as a set frequency of the output signal VO. Then the control unit calculates a set frequency-division ratio N on the output signal VO as N=1280 kHz/10 kHz=128, since the frequency of the reference signal is 10 kHz.

For the set frequency-division ratio of N=128, the control unit places the frequency-division ratio N1 of the main frequency divider 30a at 16, and places the frequency-division ratio N2 of the auxiliary frequency divider 31a at 8. That is, the control unit makes the product of the frequency-division ratio N1 and the frequency-division ratio N2 match the set frequency-division ratio on the output signal VO.

The main frequency divider 30a divides the output signal VO of the voltage-controlled oscillator 29a by the frequency-division ratio of N1=16. The auxiliary frequency divider 31a divides the output of the main frequency divider 30a by the frequency-division ratio of N2=8, and outputs it to the distribution circuit 32a.

The distribution circuit 32a outputs the feedback signals FV1 to FV8 having mutually differing phases to the second OR gate 69 at the rise timings T1 to T8 (see FIG. 4) sequentially.

The second OR gate 69 outputs the feedback signals FV1 to FV8 to the phase comparator 12a one by one.

The generating means 3a outputs the reference signals FR1a to FR8a having mutually differing phases to the first OR gate 68 at the rise timings T1 to T8 (see FIG. 4) sequentially.

The first OR gate 68 outputs the reference signals FR1a to FR8a to the phase comparator 12a one by one.

The phase comparator 12a compares phases between the feedback signals FV1 to FV8 and the reference signals FR1a to FR8a output at the timings T1 to T8, and outputs the phase comparison signals U or D to the charge pump 20a. By using the first and the second OR gates functioning as explained above, the one phase comparator 12a is good enough for performing phase comparisons.

The charge pump 20a outputs the error signals ER1 to ER8 to the low-pass filter 21a in response to the pump-up or pump-down signals. The low-pass filter 21a outputs the control voltage CV responsive to the error signals ER1 to ER8 to the voltage-controlled oscillator 29a. The voltage-controlled oscillator 29a delivers the output signal VO responsive to the control voltage CV from an output terminal 59a.

Through repetition of the above operation in the loop, the PLL circuit 1a reaches a locked state or is pulled into synchronism, and accordingly stably delivers the output signal VO having the set frequency of 1280 kHz from the output terminal 59a. This completes the description of the operation of the PLL circuit 1a.

Figure 6:
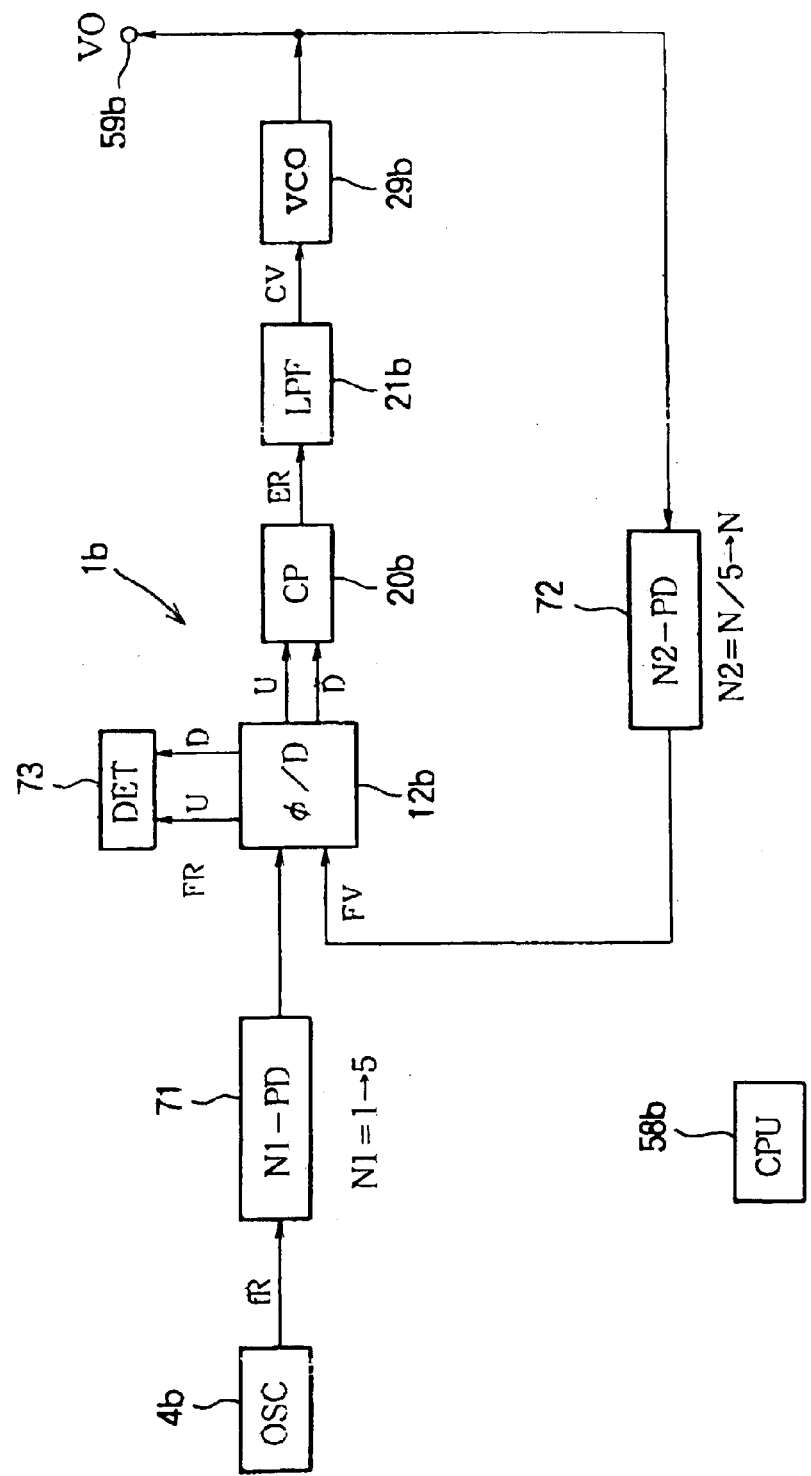
FIG. 6 is a block diagram of a PLL circuit 1b according to a third embodiment of the invention.

A PLL circuit 1b according to a third embodiment of the invention will be explained based on a block diagram shown in FIG. 6. In FIG. 6, a reference oscillator 4b outputs a governing signal fR having a frequency of 50 kHz, for example.

A first frequency divider 71 divides the output of the reference oscillator 4b, and outputs a resultant signal (a reference signal FR) to a phase comparator 12b. The first frequency divider 71, which may be a variable frequency divider, performs frequency division by a small frequency-division ratio (N1=1, for example) during start-up, and by a large frequency-division ratio (N1=5, for example) near lock.

The first frequency divider 71 may be comprised of a switch and a fixed frequency divider instead of a variable frequency divider. The switch closes during start-up for connecting the reference oscillator 4b to the phase comparator 12b directly, and opens for connecting the reference oscillator 4b to the phase comparator 12b by way of the fixed frequency divider (its frequency-division ratio being 5, for example).

A second frequency divider 72, which may be a variable frequency divider, divides the output signal VO of the voltage-controlled oscillator 29b, and outputs a feedback signal FV. The second frequency divider 72 divides the output signal VO by a small frequency-division ratio (N2= N/5, for example) during start-up, and by a large frequency-division ratio (N2=N=the set frequency-division ratio, for example) near lock.

The phase comparator 12b compares phases between the reference signal FR output from the first frequency divider 71 and the feedback signal FV output from the second frequency divider 72, and outputs a phase comparison signal U or D.

A detector 73 connected to the phase comparator 12b detects whether the PLL circuit 1b is near the locked state (a state where synchronization is roughly reached) depending on the values of the phase comparison signal U, D.

The charge pump 20b outputs an error signal ER to a low-pass filter 21b in response to the pump-up and pump-down signals. The low-pass filter 21b outputs a control voltage CV to a voltage-controlled oscillator 29b in response to the error signals ER. The voltage-controlled oscillator 29b generates an output signal VO in response to the control voltage CV.

A control unit 58b comprised of a microcomputer, for example, is connected to input means (not shown), the detector 73, the first frequency divider 71, and the second frequency divider. This PLL circuit 1b is constituted by the above-explained components.

The operation of this PLL circuit 1b will be explained with reference to FIG. 6. In FIG. 6, suppose that 1300 kHz is input into the control unit 58b as a set frequency of the output signal VO through input means (not sown), and the user presses a start key when a channel spacing frequency is 10 kHz, for example.

The control unit 58b causes the first frequency divider 71 to perform frequency division by a small frequency-division ratio (N1=1, for example), and causes the second frequency divider 72 to perform frequency division by a small frequency-division ratio (N2=N/5=26, for example) during start-up. Since the set frequency is 1300 kHz and the channel spacing frequency is 10 kHz, the frequency-division ratio setting N=1300/10=130, and N2=N/5=26.

A governing signal fR of 50 kHz output from the reference oscillator 4b, which is the reference signal FR itself since N1=1, is input into the phase comparator 12b.

The second frequency divider 72 divides the output signal VO of the voltage-controlled oscillator 29b by a frequency-division ratio of N2=26, and outputs the feedback signal FV to the phase comparator 12b.

The phase comparator 12b compares phases between the reference signal FR and the feedback signal FV, and outputs the phase comparison signal U or D to the charge pump 20b. At this time, the frequency of the reference signal FR is 50 kHz that is five times the frequency of the reference signal FR when the locked state is reached (that is, five times the channel spacing frequency of 10 kHz).

Thus the phase comparator 12b performs, during start-up (or until the locked state is roughly reached), phase comparisons at five times the speed in the locked state, and accordingly the time until the locked state is reached is shortened to 1/5 of the time in the conventional PLL circuit.

The charge pump 20b outputs the error signal ER to the low-pass filter 21b, and the low-pass filter 21b outputs the control voltage CV responsive to the error signal ER to the voltage-controlled oscillator 29b. The voltage-controlled oscillator 29b delivers the output signal VO in response to the control voltage CV from an output terminal 59b. Through repetition of the above operation in the loop, the PLL circuit 1b delivers the output signal VO having a frequency close to the set frequency of 1280 kHz from the output terminal 59*b*.

Through further repetition of the above operation in the loop, the detector 73 detects the PLL circuit 1*b* to have nearly reached the locked state (to have been nearly synchronized), and outputs a signal indicative of such state to the control unit 58*b*.

In consequence, the control unit 58*b* causes the first frequency divider 71 to perform frequency division by a large frequency-division ratio (N1=5, for example), and causes the second frequency divider 72 to perform frequency division by a large frequency-division ratio (N2=N= 130, for example).

At this time, N1 is 5, and therefore the frequency of the reference signal FR becomes 1/5 of the frequency of the governing signal fR, or becomes the same as the channel spacing frequency of 10 kHz. Additionally, since N2=N= 130, the frequency of the output signal VO approaches 10 kHz×130=1300 kHz.

In this way, through repetition of the above operation in the loop, the PLL circuit 1*b* reaches the locked state or pulled into synchronism, and stably delivers the output signal VO having the set frequency of 1300 kHz from the output terminal 59*b*.

After the locked state is nearly reached, N1 becomes 5, and the frequency of the reference signal FR becomes 10 kHz. The frequency of the reference signal FR can be expressed as fR/K where K is a quotient of the large frequency-division ratio (5, for example)/the small frequency-division ratio (1, for example) of the first frequency divider 71, and fR is the frequency of the governing signal fR.

At this time, since the frequency-division ratio of the second frequency divider 72 is N2=N, the set frequency f1 after near lock (after the locked state is nearly reached) is determined as f1=fR/K×N . . . Eq. (1).

On the other hand, during start-up, the frequency of the reference signal FR is equal to the frequency of the governing signal fR since N1=1. As explained above, by placing the frequency-division ratio setting of the second frequency divider 72 at N/K, the set frequency f2 during start-up is determines as f2=fR×N/K . . . Eq. (2).

As apparent from Eq. (1) and Eq. (2), f1 is equal to f2. As described above, by placing the frequency-division ratio setting of the second frequency divider 72 at N/K during start-up where N is the frequency-division ratio of the second frequency divider 72 and K is the quotient of the large frequency-division ratio/the small frequency-division ratio, the set frequency during start-up and the set frequency after near lock can be the same, so that lock is established smoothly and the lock-up time is shortened.

A PLL circuit 101 according to a fourth embodiment of the invention will be described with reference to FIG. 7. A reference oscillator 102 outputs a signal having a frequency of 13 MHz, for example. A first fixed frequency divider 103 divides the output signal of the reference oscillator 102 by a frequency-division ratio N1 (N1 being an integer, for example, N1=65).

A first voltage-controlled oscillator 104 outputs an intermediate signal FR having a frequency responsive to a control voltage V1 (explained later). A second fixed frequency divider 105 divides the intermediate signal FR by a frequency-division ratio N2 (N2 being an integer, for example, N2=4).

A first phase comparator 106 compares phases between the output of the first fixed frequency divider 103 and the output of the second fixed frequency divider 105, and outputs a phase comparison signal (an up signal or down signal) to a charge pump (not shown). The charge pump outputs an error signal to a filter 107 in response to the phase comparison signal.

The filter 107 filters the error signal, and outputs the control voltage V1 to the first voltage-controlled oscillator 104. In this way, the first phase comparator 106 outputs the phase comparison signal to the first voltage-controlled oscillator 104.

The first phase comparator 106, the charge pump, the filter 107, the first voltage-controlled oscillator 104, the second fixed frequency divider 105, and so on constitute a closed loop, or a PLL frequency synthesizer 108.

Through repetition of the phase comparisons, the output of the first fixed frequency divider 103 and the output of the second fixed frequency divider 105 are synchronized with each other. At this time, when the frequency of the intermediate signal FR is x kHz, the following equation holds. 13000 kHz/N1=x kHz/N2, so x=(13000 kHz/N1)×N2= (13000 kHz/65)×4 =800 kHz . . . Eq. (3).

A converter 110 divides the intermediate signal FR by a frequency-division ratio N3 (N3 being an integer, for example, N3=4) to produce a plurality of reference signals FR1, FR2, FR3, FR4 each having a reference frequency of 200 kHz and mutually differing phases, and outputs them to second phase comparators 114 to 117.

Figure 8:
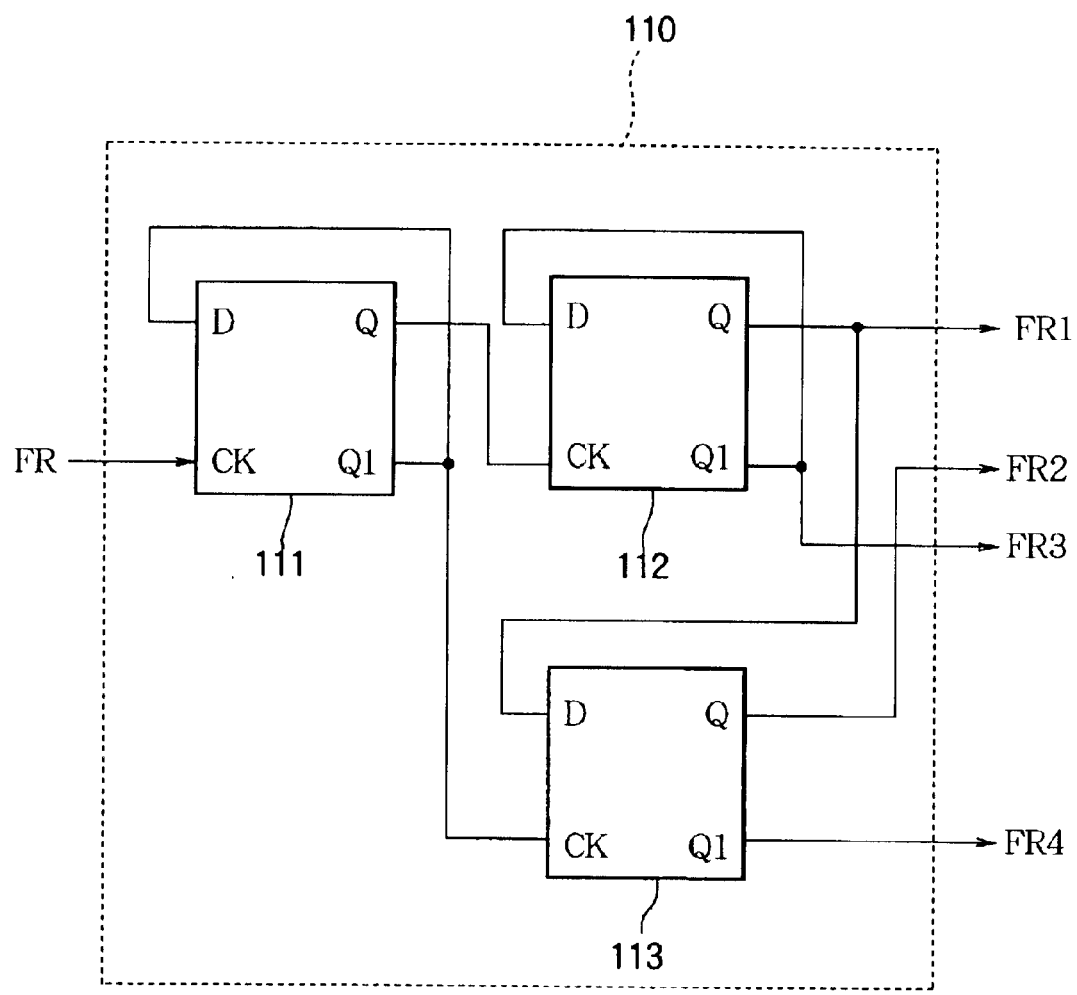
FIG. 8 is a block diagram of a converter 109 within the PLL circuit 101.

As shown in a block diagram of FIG. 8, the converter 110 is comprised of D-type flip-flops 111, 112, 113 (flip-flops of the delayed type). The intermediate signal FR is input into the clock terminal CK of the D-type flip-flop 111. The input terminal D and the inversion terminal Q1 of the D-type flip-flop 111 are connected to the clock terminal CK of the D-type flip-flop 113. The output terminal Q of the D-type flip-flop 111 is connected to the clock terminal CK of the D-type flip-flop 112.

The reference signal FR1 is output from the output terminal Q of the flip-flop 112. The input terminal D and the inversion terminal Q1 of the flip-flop 112 are connected with each other, and the reference signal FR3 is output from the node.

The input terminal D of the flip-flop 113 is connected to the output terminal Q of the flip-flop 112. The reference signal FR2 is output from the output terminal Q of the flip-flop 113. The reference signal FR4 is output from the inversion terminal Q1 of the flip-flop 113. The converter 110 is constituted by the above-explained components.

As explained above with reference to FIG. 7, the frequency-division ratio N2 (N2=4, for example) of the second fixed frequency divider 105 is identical with the frequency-division ratio N3 (N3=4, for example) of the converter 110.

The second phase comparator 114 receives the reference signal FR1 at its one input. The second phase comparator 115 receives the reference signal FR2 at its one input. The second phase comparator 116 receives the reference signal FR3 at its one input. The second phase comparator 117 receives the reference signal FR4 at its one input.

A second voltage-controlled oscillator 118 delivers an output VO having a frequency responsive to a control voltage CV (mentioned later). A variable frequency divider 119 divides the output VO received from the second voltage-controlled oscillator 118 through a switch 120, and outputs a feedback signal FV1 to the second phase comparator 114.

A variable frequency divider 121 divides the output VO received through a switch 122, and outputs a feedback signal FV2 to the second phase comparator 115. A variable frequency divider 123 divides the output VO received through a switch 124, and outputs a feedback signal FV3 to the second phase comparator 116. A variable frequency divider 125 divides the output VO received through a switch 126, and outputs a feedback signal FV4 to the second phase comparator 117.

The second phase comparator 114 compares phases between the reference signal FR1 having the reference frequency of 200 kHz and the feedback signal FV1, and outputs a phase comparison signal to a charge pump (not shown). The charge pump converts the phase comparison signal to an error signal ER1, and supplies it to a low-pass filter 127.

The second phase comparator 115 compares phases between the reference signal FR2 having the reference frequency of 200 kHz and the feedback signal FV2, and outputs a phase comparison signal to a charge pump (not shown). The charge pump converts the phase comparison signal to an error signal ER2, and supplies it to the low-pass filter 127.

The second phase comparator 116 compares phases between the reference signal FR3 having the reference frequency of 200 kHz and the feedback signal FV3, and outputs a phase comparison signal to a charge pump (not shown). The charge pump converts the phase comparison signal to an error signal ER3, and supplies it to the low-pass filter 127.

The second phase comparator 117 compares phases between the reference signal FR4 having the reference frequency of 200 kHz and the feedback signal FV4, and outputs a phase comparison signal to a charge pump (not shown). The charge pump converts the phase comparison signal to an error signal ER4, and supplies it to the low-pass filter 127.

In this way, the second phase comparators 114, 115, 116, 117 compare phases between the reference signals FR1, FR2, FR3, FR4 and the outputs FV1, FV2, FV3, FV4 of the variable frequency dividers 119, 121, 123, 125 respectively, and output a plurality of the phase comparison signals.

As explained above, a plurality of the second phase comparators 114, 115, 116, 117 (four, for example) and a plurality of the variable frequency dividers 119, 121, 123, 125 (four, for example) are used in this embodiment.

The low-pass filter 127 filters the error signals ER1 to ER4, and outputs the control voltage CV to the second voltage-controlled oscillator 118. This PLL circuit 101 is constituted by the above-explained components.

Next, the operation of the PLL circuit 101 is explained with reference to FIGS. 7 to 9. FIG. 7 is a timing diagram of various signals in the PLL circuit 101.

In these figures, when the user presses a start key (not shown), the PLL circuit 101 starts to operate. A control unit comprised of a microcomputer (not shown) closes (or turns on) the switches 120, 122, 124, 126. The control unit causes the reference oscillator 102 to output a signal having a frequency of 13 MHz, for example.

The first fixed frequency divider 103 divides this signal by the frequency-division ratio N1, and outputs it to the first phase comparator 106. The second fixed frequency divider 105 divides the intermediate signal FR output from the first voltage-controlled oscillator 104 by the frequency-division ratio N2, and outputs it to the first phase comparator 106.

The first phase comparator 106 compares phases between the output of the first fixed frequency divider 103 and the output of the second fixed frequency divider 105, and outputs the phase comparison signal to the charge pump. The charge pump converts the phase comparison signal to the error signal, and supplies it to the filter 107.

The filter 107 converts the error signal into the control voltage V1, and outputs it to the first voltage-controlled oscillator 104. The first voltage-controlled oscillator 104 outputs the intermediate signal FR having a frequency responsive to the control voltage V1. Through repetition of the phase comparisons in the PLL frequency synthesizer 108, a locked state is reached, and the intermediate signal FR having the frequency of 800 kHz is output to the converter 110 (the intermediate signal FR is being output to the converter 110 before the locked state is reached).

The converter 110 divides the intermediate signal FR of 800 kHz by the frequency-division ratio N3 (N3=4, for example) to produce the reference signals FR1, FR2, FR3, FR4 having the reference frequency of 200 kHz and different phases.

Figure 9:
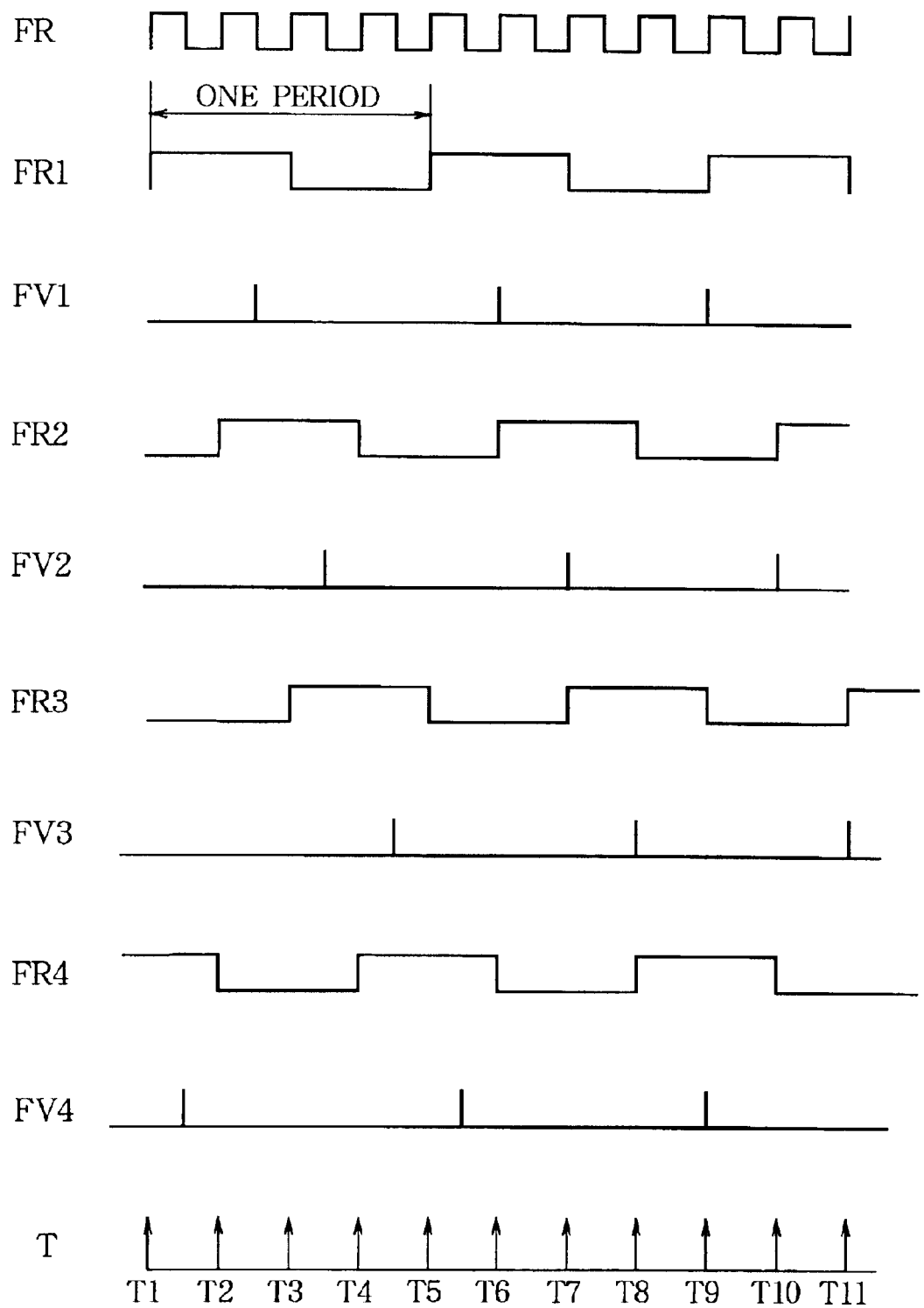
FIG. 9 is a timing diagram of various signals used in the PLL circuit 101.

As shown in FIG. 9, the reference signal FR1 that rises at the timings T1, T5, T9 is input into the second phase comparator 114. The reference signal FR2 that lags 1/4 period behind the reference signal FR1 to rise at the timings T2, T6, T10 is input into the second phase comparator 115.

The reference signal FR3 that lags 2/4 period behind the reference signal FR1 to rise at the timings T3, T7, T11 is input into the second phase comparator 116. The reference signal FR4 that lags 3/4 period behind the reference signal FR1 to rise at the timings T4, T8 is input into the second phase comparator 117.

On the other hand, the output VO of the second voltage-controlled oscillator 117 is received and divided by the variable frequency divider 119 through the switch 120, and then supplied to the second phase comparator 114 as the feedback signal FV1. Similarly, the feedback signals FV2, FV3, FV4 are supplied to the phase comparators 115, 116, 117 respectively.

The second phase comparator 114 compares phases between the reference signal FR1 and the feedback signal FV1, and as a result, supplies the error signal ER1 to the low-pass filter 127. Similarly, the error signals ER2, ER3, ER4 are supplied to the low-pass filter 127. In consequence, the second phase comparators 114, 115, 116, 117 perform the phase comparisons four times at the timings T1, T2, T3, T4 as a whole during one period of the reference signal FR1.

The error signals ER1, ER2, ER3, ER4 are converted into the control voltage CV by the low-pass filter 127, and the second voltage-controlled oscillator 118 delivers the output VO having a frequency that is proportional to the control voltage CV.

As explained above, the second phase comparator 114 compares phases between the reference signal FR1 and the feedback signal FV1 taking the timing T1 as a reference point. The second phase comparator 115 compares phases between the reference signal FR2 and the feedback signal FV2 taking the timing T2 as a reference point.

The second phase comparator 116 compares phases between the reference signal FR3 and the feedback signal FV3 taking the timing T3 as a reference point. The second phase comparator 117 compares phases between the reference signal FR4 and the feedback signal FV4 taking the timing T4 as a reference point.

As described above, the reference signals FR2, FR3, FR4 are shifted from the reference signal FR1 by $\pi/2$, $\pi$, $3\pi/4$ respectively and the phase comparisons are performed four times during one period of the reference signal FR1, so the lock-up time is shortened to approximately 1/4 of the conventional lock-up time.

When the frequency of the reference signals FR1, FR2, FR3, FR4 is A, the equation of A=x/N3 holds since they result from dividing the intermediate signal FR of x kHz by N3. When the oscillation frequency is B kHz, substituting Eq. (3) into this equation yields an equation of A=x/N3=(B/N1)/N3×N2. From this equation, N1 can be determined as N1=(B/A)×(N2/N3). . . Eq. (4).

If the frequency-division ratio N2 and the frequency-division ratio N3 are the same, N1=B/A. As described above, in this configuration according to the invention, the frequency-division ratio N1 of the first fixed frequency divider 103 is equal to a ratio of the oscillation frequency B of the reference oscillator 102 (B=13000 kHz, for example) to the reference frequency A (or the channel spacing frequency which is 200 kHz in GSM, for example). Accordingly, the frequency-division ratio N1 is an integer. In consequence, the PLL circuit of the fourth embodiment is easy to manufacture and low in cost.

Furthermore, a PLL circuit having any number of phase comparators can be configured easily by placing the frequency-division ratio N2 of the second fixed frequency divider 105 at the number of the phase comparators 114 to 117.

Although the number of the variable frequency dividers 119, 121, 123, 125 and the number of the phase comparators 114, 115, 116, 117 are four in the fourth embodiment described above, the present invention is not limited thereto.

For example, the four variable frequency dividers 119, 121, 123, 125 may be replaced by one variable frequency divider that serves the functions of the variable frequency dividers 119, 121, 123, 125 through time sharing operation.

Likewise, the phase comparators 114, 115, 116, 117 may be replaced by one phase comparator that serves the functions of the phase comparators 114, 115, 116, 117 through time sharing operation.

Figure 10:
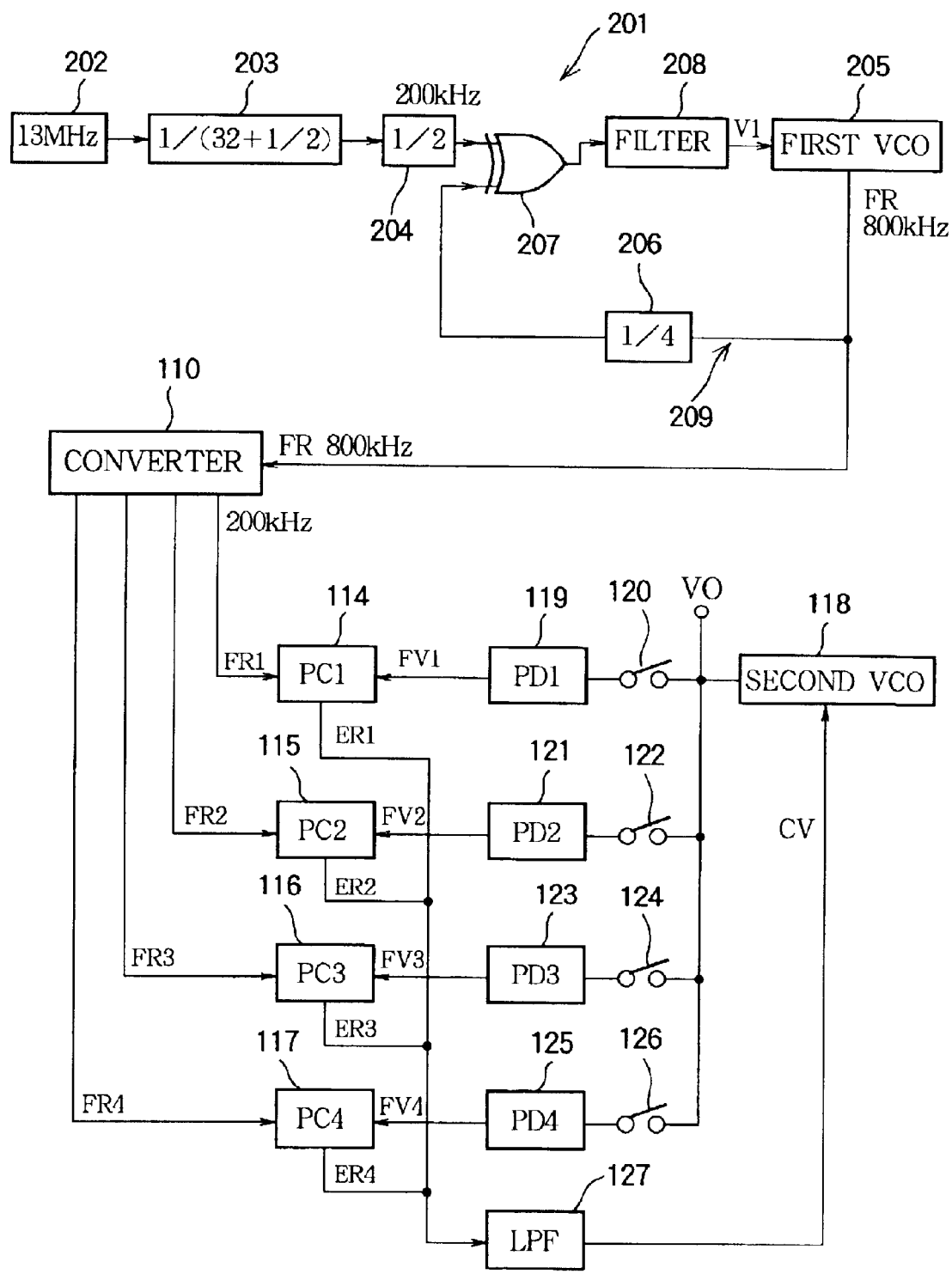
FIG. 10 is a block diagram of a PLL circuit 201 according to a fifth embodiment of the invention.

A PLL circuit 201 according to a fifth embodiment of the invention will be described with reference to FIG. 10. In FIG. 10, the reference numerals identical to those in FIG. 7 represent the same elements. A reference oscillator 202 outputs a signal having a frequency of 13 MHz, for example. A first fixed frequency divider 203 divides the output of the reference oscillator 202 by a frequency-division ratio of N+1/2 (N being an integer, for example, N=32). A second fixed frequency divider 204 divides the output of the first fixed frequency divider 203 by 2.

A first voltage-controlled oscillator 205 outputs an intermediate signal FR having a frequency responsive to a control voltage V1 (mentioned later). A third fixed frequency divider 206 divides the intermediate signal FR by a frequency-division ratio of N1 (N1 being an integer, for example, N1=4).

A first phase comparator 207 compares phases between the output of the second fixed frequency divider 204 and the output of the third fixed frequency divider 206, and outputs a phase comparison signal (an up signal or down signal) to a charge pump (not shown). The charge pump outputs an error signal to a filter 208 in response to the phase comparison signal. The first phase comparator 207 is preferably an EX-OR (EXCLUSIVE OR) gate.

The filter 208 filters the error signal, and outputs the control voltage V1 to the first voltage-controlled oscillator 205. In this way, the first phase comparator 207 outputs the phase comparison signal to the first voltage-controlled oscillator 205.

The first phase comparator 207, the charge pump, the filter 208, the first voltage-controlled oscillator 205, the third fixed frequency divider 206, and soon constitute a closed loop, or a PLL frequency synthesizer 209.

Through repetition of the phase comparisons, the output of the second fixed frequency divider 204 and the output of the third fixed frequency divider 206 are synchronized with each other. At this time, when the frequency of the intermediate signal FR is x kHz and the oscillation frequency is B kHz, the equation of B/(N+1/2)/2=x/N1 holds. Accordingly, the following equation is obtained.

$$x = B \times N1/(N+1/2) \times 1/2 = 800 \text{ kHz} \ldots \quad \text{Eq.(5)}.$$

A converter 110 divides the intermediate signal FR by a frequency-division ratio of N2 (N2 being an integer, for example, N2=4) to produce reference signals FR1, FR2, FR3, FR4 having the reference frequency of 200 kHz and different phases, and outputs them to second phase comparators 114 to 117. In this way, the converter 110 outputs the reference signals FR1 to FR4 the number of which is equal to the frequency-division ratio N2 (four in this embodiment).

As explained above, the frequency-division ratio N1 (N1=4, for example) of the third fixed frequency divider 206 is identical with the frequency-division ratio N2 (N2=4, for example) of the converter 110.

Figure 7:
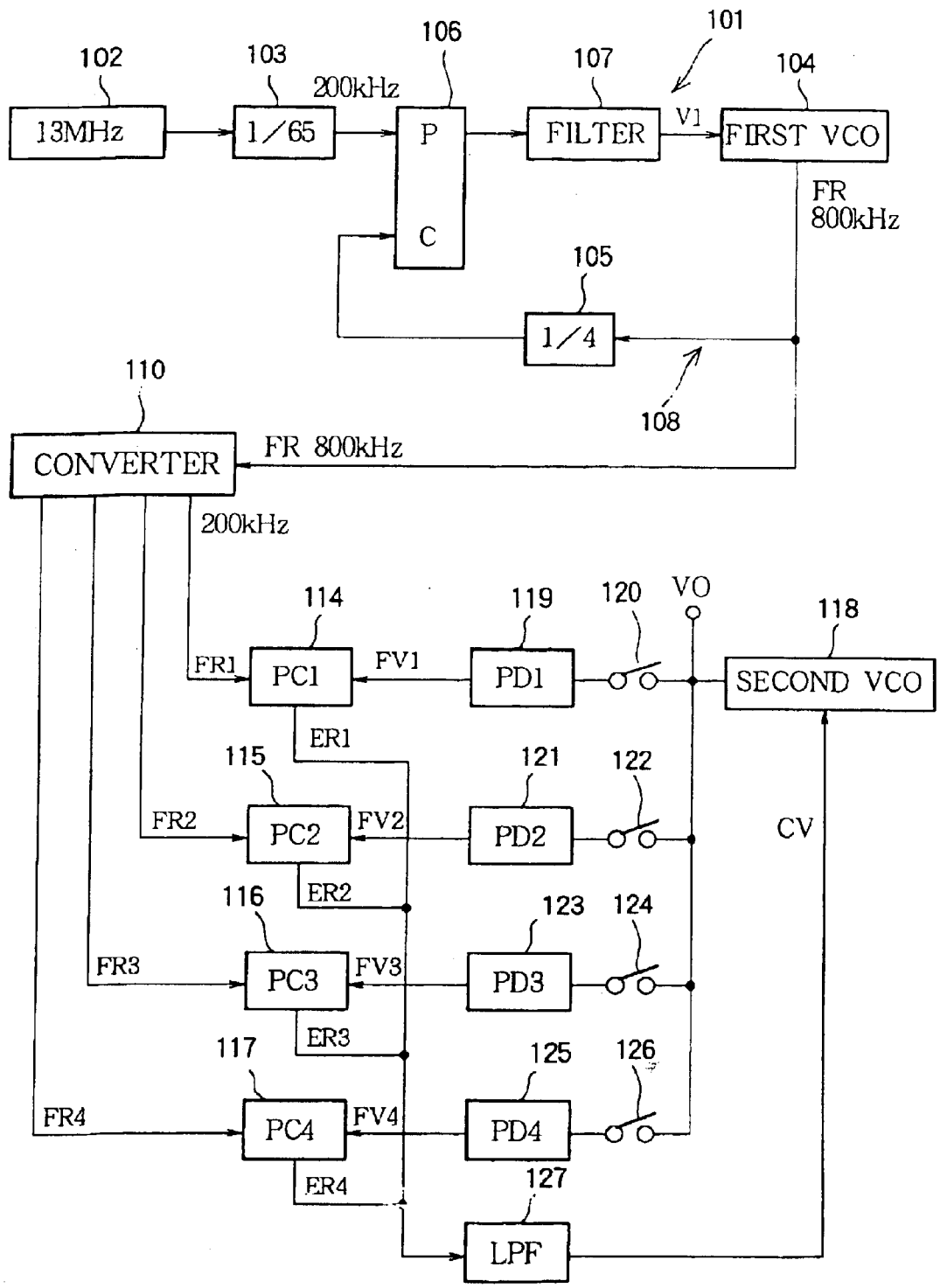
FIG. 7 is a block diagram of a PLL circuit 101 according to a fourth embodiment of the invention.

Since the structure of the converter 110 shown in FIG. 10 is the same as that of the converter 110 shown in FIG. 7, or the structure shown in FIG. 8, explanation thereof will be omitted. Likewise, since the functions and operations of the second phase comparators 114 to 117, the variable frequency dividers 119, 121, 123, 125, the second voltage-controlled oscillator 118, and the low-path filter 127 are the same as the functions and operations of those shown in FIG. 7, explanation thereof will be omitted.

Next, the operation of the PLL circuit 201 is explained with reference to FIG. 10. When the user presses a start key (not shown), the PLL circuit 201 starts to operate. A control unit comprised of a microcomputer (not shown) closes (or turns on) the switches 120, 122, 124, 126. The control unit causes the reference oscillator 202 to output a signal having a frequency of 13 MHz, for example.

The first fixed frequency divider 203 divides this signal by the frequency-division ratio of N1+1/2. The second fixed frequency divider 204 divides the output of the first fixed frequency divider 203 by two, and outputs it to the first phase comparator 207. The third fixed frequency divider 206 divides the intermediate signal FR output from the first voltage-controlled oscillator 205 by the frequency-division ratio N2, and outputs it to the first phase comparator 207.

The first phase comparator 207 compares phases between the output of the second fixed frequency divider 204 and the output of the third fixed frequency divider 206, and outputs the phase comparison signal to the charge pump. The charge pump converts the phase comparison signal to the error signal, and supplies it to the filter 208.

The filter 208 converts the error signal into the control voltage V1, and outputs it to the first voltage-controlled oscillator 205. The first voltage-controlled oscillator 205 outputs the intermediate signal FR having a frequency responsive to the control voltage V1. Through repetition of the phase comparisons in the PLL frequency synthesizer 209, a locked state is reached, and the intermediate signal FR having the frequency of 800 kHz is output to the converter 110 (the intermediate signal FR is being output to the converter 110 before the locked state is reached).

The converter 110 divides the intermediate signal FR of 800 kHz by the frequency-division ratio N2 (N2=4, for example) to produce the reference signals FR1, FR2, FR3, FR4 having the reference frequency of 200 kHz and different phases.

Afterwards, the second phase comparators 114 to 117, the variable frequency dividers 119, 121, 123, 125, the second voltage-controlled oscillator 118, and the low-path filter 127 perform the operations that are the same as those explained above with reference to the timing diagram of FIG. 9. Thus the reference signals FR2, FR3, FR4 are shifted from the reference signal FR1 by $\pi/2$, $\pi$, $3\pi/4$ respectively and the phase comparisons are performed four times during one period of the reference signal FR1, the lock-up time is therefore shortened to approximately 1/4 of the conventional lock-up time.

In the fifth embodiment, when the frequency of the reference signals FR1, FR2, FR3, FR4 is A, the equation of A=x/N2 holds since they result from dividing the intermediate signal FR of x kHz by N2. When the oscillation frequency is B kHz, substituting Eq. (5) into this equation yields an equation of A=B×N1 (N+1/2)×1/2×1/N2. From this equation, N+1/2 can be obtained as N+1/2=(B/2A)×(N1/N2). . . Eq. (6).

If the frequency-division ratio N1 and the frequency-division ratio N2 are the same, N+1/2=B/2A. As explained above, in the fifth embodiment, the frequency-division ratio N+1/2, which is 32+1/2, for example, of the first fixed frequency divider 203 is equal to a ratio of the oscillation frequency B (B=13000 kHz, for example) of the reference oscillator 202 to a given multiple of the reference frequency A (or the channel spacing frequency which is 200 kHz in GSM, for example), and does not include a fraction of 1/4. In consequence, the PLL circuit of the fifth embodiment is easy to manufacture and low in cost.

Furthermore, a PLL circuit having any number of phase comparators can be configured easily by placing the frequency-division ratio N1 of the third fixed frequency divider 206 at the number of the reference signals FR1 to FR4.

Although the number of the variable frequency dividers 119, 121, 123, 125 and the number of the phase comparators 114, 115, 116, 117 are four in the fifth embodiment described above, the present invention is not limited thereto.

For example, the four variable frequency dividers 119, 121, 123, 125 may be replaced by one variable frequency divider that serves the functions of the variable frequency dividers 119, 121, 123, 125 through time sharing operation.

Likewise, the phase comparators 114, 115, 116, 117 may be replaced by one phase comparator that serves the functions of the phase comparators 114, 115, 116, 117 through time sharing operation.

Figure 11:
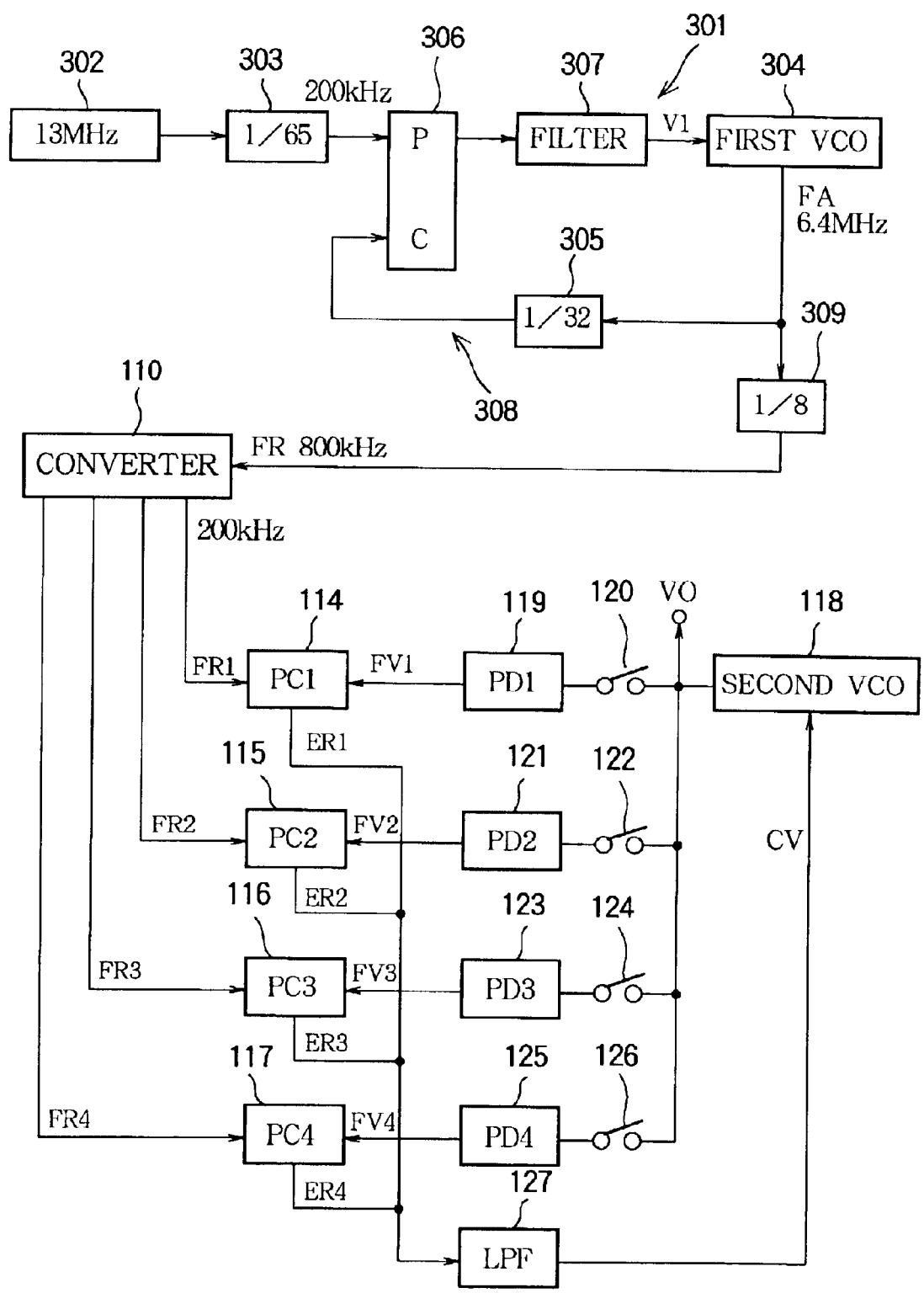
FIG. 11 is a block diagram of a PLL circuit 301 according to a sixth embodiment of the invention.

A PLL circuit 301 according to a sixth embodiment of the invention will be described with reference to FIG. 11. In FIG. 11, the reference numerals identical to those in FIG. 7 represent the same elements. A reference oscillator 302 outputs a signal having a frequency of 13 MHz, for example. A first fixed frequency divider 303 divides the output signal of the reference oscillator 302 by a frequency-division oscillator of N1 (N1 being an integer, for example, N1=65).

A first voltage-controlled oscillator 304 outputs an output signal FA having a frequency responsive to a control voltage V1 (mentioned later).

A second fixed frequency divider 305 divides the output signal FA by a frequency-division ratio of N2 (N2 being an integer, for example, N2=32).

A first phase comparator 106 compares phases between the output of the first fixed frequency divider 303 and the output of the second fixed frequency divider 305, and outputs a phase comparison signal (an up signal or down signal) to a charge pump (not shown). The charge pump outputs an error signal to a filter 307 in response to the phase comparison signal.

The filter 307 filters the error signal, and outputs the control voltage V1 to the first voltage-controlled oscillator 304. In this way, the first phase comparator 306 outputs the phase comparison signal to the first voltage-controlled oscillator 304.

The first phase comparator 306, the charge pump, the filter 307, the first voltage-controlled oscillator 304, the second fixed frequency divider 305, and so on constitute a closed loop, or a PLL frequency synthesizer 308.

A third fixed frequency divider 309 divides the output signal FA of the first voltage-controlled oscillator 304 by a frequency-division ratio of N3 (N3 being an integer, for example, N3=8), and outputs an intermediate signal FR to a converter 110.

Through repetition of the phase comparisons in the PLL frequency synthesizer 308, the output of the first fixed frequency divider 303 and the output of the second fixed frequency divider 305 are synchronized with each other. At this time, when the oscillation frequency of the reference oscillator 302 is B kHz, the frequency of the output signal FA of the first voltage-controlled oscillator 304 is C kHz, and the frequency of the intermediate signal FR is D kHz, the following equations hold.

$$B/N1=C/N2 \quad \text{Eq. (7)}$$

$$D=C/N3 \quad \text{Eq (8)}$$

From these equations, the following equation is obtained.

$$D=(B\times N2)/(N1\times N3) \quad \text{Eq. (9)}$$

By substituting specific values into this equation, D is determined as 800 kHz.

The converter 110 divides the intermediate signal FR by a frequency-division ratio of N4 (N4 being an integer, for example, N4=4) to produce reference signals FR1, FR2, FR3, FR4 having the reference frequency of 200 kHz and different phases, and outputs them to the second phase comparators 114 to 117. As explained above, the frequency-division ratio N2 (32, for example) is placed at the product of the frequency-division ratio N3 (8, for example) and the frequency-division ratio N4 (4, for example).

Since the structure of the converter 110 shown in FIG. 11 is the same as that of the converter 110 shown in FIG. 7, or the structure shown in FIG. 8, explanation thereof will be omitted. Likewise, since the functions and operations of the second phase comparators 114 to 117, the variable frequency dividers 119, 121, 123, 125, the second voltage-controlled oscillator 118, and the low-path filter 127 are the same as the functions and operations of those shown in FIG. 7, explanation thereof will be omitted.

Next, the operation of the PLL circuit 301 is explained with reference to FIG. 11. In FIG. 11, when the user presses a start key (not shown), the PLL circuit 301 starts to operate. A control unit comprised of a microcomputer (not shown) closes (or turns on) the switches 120, 122, 124, 126. The control unit causes the reference oscillator 302 to output a signal having a frequency of 13 MHz, for example.

The first fixed frequency divider 303 divides this signal by the frequency-division ratio N1, and outputs it to the first phase comparator 306. The second fixed frequency divider 305 divides the output signal FA received from the first voltage-controlled oscillator 304 by the frequency-division ratio N2, and outputs it to the first phase comparator 306.

The first phase comparator 306 compares phases between the output of the first fixed frequency divider 303 and the output of the second fixed frequency divider 305, and outputs the phase comparison signal to the charge pump. The charge pump converts the phase comparison signal to the error signal, and supplies it to the filter 307.

The filter 307 converts the error signal into the control voltage V1, and outputs it to the first voltage-controlled oscillator 304. The first voltage-controlled oscillator 304 outputs the output signal FA having a frequency responsive to the control voltage V1. Through repetition of the phase comparisons in the PLL frequency synthesizer 308, a locked state is reached, and the output signal FA having the frequency of 6.4 MHz (200 kHz×32) is output to the converter 110 through the third fixed frequency divider 309 (the intermediate signal FR is being output to the converter 110 before the locked state is reached).

The converter 110 divides the intermediate signal FR of 800 kHz by the frequency-division ratio N4 (N4=4, for example) to produce the reference signals FR1, FR2, FR3, FR4 having the reference frequency of 200 kHz and different phases.

Afterwards, the second phase comparators 114 to 117, the variable frequency dividers 119, 121, 123, 125, the second voltage-controlled oscillator 118, and the low-path filter 127 perform the operations that are the same as those explained above with reference to the timing diagram of FIG. 9. As described above, the reference signals FR2, FR3, FR4 are shifted from the reference signal FR1 by $\pi/2$, $\pi$, $3\pi/4$ respectively and the phase comparisons are performed four times during one period of the reference signal FR1, the lock-up time is shortened to approximately 1/4 of the conventional lock-up time.

In the sixth embodiment, when the frequency of the reference signals FR1, FR2, FR3, FR4 is A, the equation of A=D/N4 holds since they result from dividing the intermediate signal FR of D kHz by N4. Substituting Eq. (9) into this equation yields the equation of A=D/N4=(B×N2)/(N1×N3)×1/N4. From this equation, N1 is determined as $$N1=(B/A)\times(N2/(N3\times N4))\ldots \quad \text{Eq. (10)}$$

At this time, when the product of the frequency-division ratios N3 and N4 is placed at the frequency-division ratio N2, N1 equals to B/A. As described above, in the sixth embodiment, the frequency-division ratio N1 of the first fixed frequency divider 303 is equal to a ratio of the oscillation frequency B of the reference oscillator 302 (B=13000 kHz, for example) to the reference frequency A (or the channel spacing frequency, which is 200 kHz in GSM, for example). In consequence, the frequency-division ratio N1 is an integer, and accordingly, the PLL circuit is easy to manufacture and low in cost.

Furthermore, a PLL circuit having any number of phase comparators can be configured easily by placing the frequency-division ratio N4 of the converter 110 at the number of the phase comparison signals.

Although the number of the variable frequency dividers 119, 121, 123, 125 and the number of the phase comparators 114, 115, 116, 117 are four in the sixth embodiment described above, the present invention is not limited thereto.

For example, the four variable frequency dividers 119, 121, 123, 125 may be replaced by one variable frequency divider that serves the functions of the variable frequency dividers 119, 121, 123, 125 through time sharing operation.

Likewise, the phase comparators 114, 115, 116, 117 may be replaced by one phase comparator that serves the functions of the phase comparators 114, 115, 116, 117 through time sharing operation.

Figure 12:
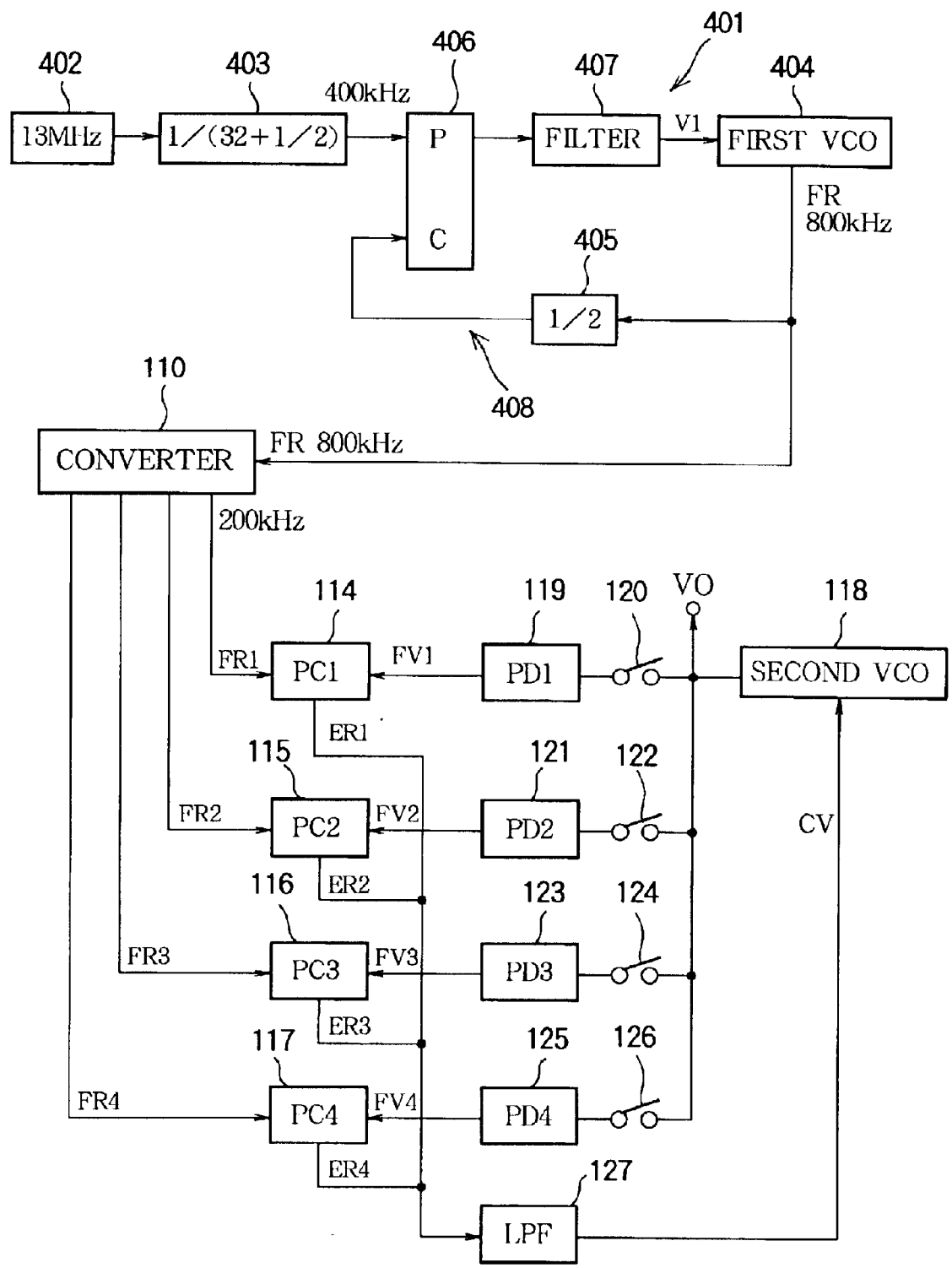
FIG. 12 is a block diagram of a PLL circuit 401 according to a seventh embodiment of the invention.

A PLL circuit 401 according to a seventh embodiment of the invention will be described with reference to FIG. 12. In FIG. 12, the reference numerals identical to those in FIG. 7 represent the same elements. A reference oscillator 402 outputs a signal having a frequency of 13 MHz, for example. A first fixed frequency divider 403 divides the output of the reference oscillator 402 by a frequency-division ratio of N+1/2 (N being an integer, for example, N=32).

A first voltage-controlled oscillator 404 outputs an output signal FR having a frequency responsive to a control voltage V1 (mentioned later). A second fixed frequency divider 405 divides the output signal FR by a frequency-division ratio of N1 (N1 being an integer, for example, N1=2).

A first phase comparator 406 compares phases between the output of the first fixed frequency divider 403 and the output of the second fixed frequency divider 405, and outputs a phase comparison signal (an up signal or down signal) to a charge pump (not shown). The charge pump outputs an error signal to a filter 407 in response to the phase comparison signal.

The filter 407 filters the error signal, and outputs the control voltage V1 to the first voltage-controlled oscillator 404. In this way, the first phase comparator 406 outputs the phase comparison signal to the first voltage-controlled oscillator 404.

The first phase comparator 406, the charge pump, the filter 407, the first voltage-controlled oscillator 404, the second fixed frequency divider 405, and so on constitute a closed loop, or a PLL frequency synthesizer 408.

Through repetition of the phase comparisons, the output of the first fixed frequency divider 403 and the output of the second fixed frequency divider 405 are synchronized with each other. At this time, when the frequency of the output signal FR is E kHz and the oscillation frequency is B kHz, the equation of B/(N+1/2)=E/N1 holds. Accordingly, the following equation is obtained.

$$E=B\times(N1/(N+1/2))=800\text{ kHz}\ldots \quad \text{Eq. (11)}$$

A converter 110 divides the output signal FR by a frequency-division ratio of N2 (N2 being an integer, for example, N2=4) to produce reference signals FR1, FR2, FR3, FR4 having the reference frequency of 200 kHz and different phases. In this way, the converter 110 outputs the reference signals FR1 to FR4 the number of which is equal to the frequency-division ratio N2 (four in this embodiment).

Since the structure of the converter 110 shown in FIG. 12 is the same as that of the converter 110 shown in FIG. 7, or the structure shown in FIG. 8, explanation thereof will be omitted. Likewise, since the functions and operations of the second phase comparators 114 to 117, the variable frequency dividers 119, 121, 123, 125, the second voltage-controlled oscillator 118, and the low-path filter 127 are the same as the functions and operations of those shown in FIG. 7, explanation thereof will be omitted.

In the seventh embodiment, the frequency-division ratio N1 (N1=4, for example) of the second fixed frequency divider 405 is identical with the frequency-division ratio N2 (N2=4, for example) of the converter 110.

Next, the operation of the PLL circuit 401 is explained with reference to FIG. 12. When the user presses a start key (not shown), the PLL circuit 401 starts to operate. A control unit comprised of a microcomputer (not shown) closes (or turns on) the switches 120, 122, 124, 126. The control unit causes the reference oscillator 402 to output a signal having a frequency of 13 MHz, for example.

The first fixed frequency divider 403 divides this signal by the frequency-division ratio N1+1/2, and outputs it to the first phase comparator 406. The second fixed frequency divider 405 divides the output signal FR received from the first voltage-controlled oscillator 404 by the frequency-division ratio N1, and outputs it to the first phase comparator 406.

The first phase comparator 406 compares phases between the output of the first fixed frequency divider 403 and the output of the second fixed frequency divider 405, and outputs the phase comparison signal to the charge pump. The charge pump converts the phase comparison signal to the error signal, and supplies it to the filter 407.

The filter 407 converts the error signal into the control voltage V1, and outputs it to the first voltage-controlled oscillator 404. The first voltage-controlled oscillator 404 outputs the output signal FR having a frequency responsive to the control voltage V1. Through repetition of the phase comparisons in the PLL frequency synthesizer 408, a locked state is reached, and the output signal FR having the frequency of 800 kHz is output to the converter 110 (the output signal FR is being output to the converter 110 before the locked state is reached).

The converter 110 divides the output signal FR of 800 kHz by the frequency-division ratio N2 (N2=4, for example) to produce the reference signals FR1, FR2, FR3, FR4 having the reference frequency of 200 kHz and different phases.

Afterwards, the second phase comparators 114 to 117, the variable frequency dividers 119, 121, 123, 125, the second voltage-controlled oscillator 118, and the low-path filter 127 perform the operations that are the same as those explained above with reference to the timing diagram of FIG. 9. Accordingly, the reference signals FR2, FR3, FR4 are shifted from the reference signal FR1 by $\pi/2$, $\pi$, $3\pi/4$ respectively and the phase comparisons are performed four times during one period of the reference signal FR1, the lock-up time is shortened to approximately 1/4 of the conventional lock-up time.

In the seventh embodiment, when the frequency of the reference signals FR1, FR2, FR3, FR4 is A, the equation of A=E/N2 holds since they result from dividing the output signal FR of E kHz by N2. Substituting Eq. (10) into this equation yields the equation of $A=B\times(N1/(N+1/2))\times 1/N2$. From this equation, N+1/2 can be obtained as $N+1/2=(B/2A)\times(2\times N1/N2)$... Eq. (12).

If the frequency-division ratio N2 is set at a multiple of the frequency-division ratio N1, the equation of $N+1/2=B/2A$ holds. As described above, in the seventh embodiment, the frequency-division ratio N1+1/2 of the first fixed frequency divider 403 is equal to a ratio of the oscillation frequency B of the reference oscillator 402 (B=13000 kHz, for example) to the reference frequency A (or the channel spacing frequency, which is 200 kHz in GSM, for example). Inconsequence, the frequency-division ratio N is an integer, and accordingly, the PLL circuit is easy to manufacture and low in cost.

Furthermore, a PLL circuit having any number of phase comparators can be configured easily by placing the frequency-division ratio N2 of the converter 110 at the number of the reference signals FR1 to FR4.

Although the number of the variable frequency dividers 119, 121, 123, 125 and the number of the phase comparators 114, 115, 116, 117 are four in the seventh embodiment described above, the present invention is not limited thereto.

For example, the four variable frequency dividers 119, 121, 123, 125 may be replaced by one variable frequency divider that serves the functions of the variable frequency dividers 119, 121, 123, 125 through time sharing operation. Likewise, the phase comparators 114, 115, 116, 117 may be replaced by one phase comparator that serves the functions of the phase comparators 114, 115, 116, 117 through time sharing operation.

INDUSTRIAL APPLICABILITY

A PLL circuit according to one aspect of the invention includes:

a generating means (3) for generating a plurality of reference signals (fR1 to fR8) having mutually differing phases;

a main frequency divider (30) dividing an output signal (fVCO) of a voltage-controlled oscillator (29) by a frequency-division ratio of N1;

an auxiliary frequency divider (31) dividing an output (fV') of the main frequency divider (30) by a frequency-division ratio of N2;

a distribution circuit (32) distributing an output (Q1a, Q2a, Q3a) of the auxiliary frequency divider (31) as a plurality of feedback signals (fV1 to fV8); and a phase comparing unit (12 to 19) comparing the reference signals with the feedback signals to output error signals (ER1 to ER8);

each of the main frequency divider and the auxiliary frequency divider being comprised of a variable frequency divider or a counter.

In this configuration, since phase comparisons are performed multiple times during one period of the reference signal through comparing a plurality of the reference signals having different phases with the corresponding feedback signals, the lock-up time is shortened. Furthermore, division of the output signal is performed by two frequency dividers, namely, the main and auxiliary frequency dividers, so as many as four frequency dividers are not required unlike before. Accordingly, the cost is low, LSI implementation is easy, and the amount of power consumed is small. Moreover, since the main frequency divider and auxiliary frequency divider are constituted by programmable dividers or counters, the combination of the frequency-division ratio N1 of the main frequency divider and the frequency-division ratio N2 of the auxiliary divider can be selected freely.

The product of the frequency-division ratio N1 and the frequency-division ratio N2 may match a set frequency-division ratio on the output signal (fVCO).

In such a structure, if the frequency of the reference signal is fR1, the frequency of the output signal is fVCO, the frequency of the intermediate signal output from the main frequency divider is fV', and the set frequency-division ratio is N, then fR1=fVCO/N, fVCO=N1×fV', and N=N1×N2. In consequence, fR1=(N1×fV')/(N1×N2)=fV'/N2. The reference signals are therefore the intermediate signal with its frequency divided by N2, and the rise timings of the reference signals match the rise timings of the feedback signals. The comparisons between the feedback signals and the reference signals that have different phases are therefore performed at the same timings, so the phase comparisons can be performed accurately.

The size of the frequency-division ratio N2 of the auxiliary divider (31) may be determined in accordance with the size of the set frequency-division ratio. In such a structure, the amount of power consumed by the auxiliary divider can be reduced by reducing the frequency-division ratio N2 of the auxiliary divider when the set frequency-division ratio is small.

If the PLL device includes a plurality of phase comparators that compare the reference signals with the feedback signals, and the frequency-division ratio N2 is equal to or less than the number of the phase comparators, then the optimal frequency-division ratio N2 can be selected according to the size of the set frequency-division ratio, the desired lock-up time, the desired amount of power consumption, and so on.

The PLL device may be adapted to have the main frequency divider (30) and the auxiliary frequency divider (31) divide the output signal (fVCO), then afterward to have only the main frequency divider (30) divide the output signal, for a predetermined set frequency-division ratio on the output signal.

In this structure, even if the set frequency-division ratio cannot be expressed as a product of the frequency-division ratio N1 of the main frequency divider and the frequency-division ratio N2 of the auxiliary frequency divider, an output signal responsive to the set frequency-division ratio N can be obtained by having the frequency division performed by both dividers at first, and afterwards having the frequency division by N performed by the main frequency divider alone. Moreover, if the set frequency-division ratio N can be expressed as a product of the frequency-division ratio N1 and the frequency-division ratio N2, it is possible to shorten the lock-up time by having the frequency division performed by the main frequency divider and the auxiliary frequency divider during start-up. In addition, the amount of power consumed can be further reduced by having the frequency division performed by the main frequency divider 430 alone after start-up (for example, when the set frequency-division ratio N has been reached).

A PLL circuit according to another aspect of the invention includes:
- a generating means (3a) for generating a plurality of reference signals (FR1a to FR8a) having mutually differing phases;
- a main frequency divider (30a) dividing an output signal (VO) of a voltage-controlled oscillator (29a) by a frequency-division ratio of N1;
- an auxiliary frequency divider (31a) dividing an output (FV') of the main frequency divider by a frequency-division ratio of N2;
- a distributing unit (32a) distributing an output of the auxiliary frequency divider as a plurality of feedback signals (FV1 to FV8); and
- a phase comparing unit (12a) comparing phases between the reference signal (FR1a to FR8a) with the feedback signal (FV1 to FV8) to output a plurality of phase comparison signals (U, D),
- the phase comparing unit being comprised of a single phase comparator.

In such a structure, division of the output signal is performed by two frequency dividers, namely, the main and auxiliary frequency dividers, so as many as eight frequency dividers are not required unlike before. Accordingly, the cost is low, LSI implementation is easy, and the amount of power consumed is small. Furthermore, since the PLL circuit includes only one phase comparator, LSI implementation is easy and the cost is low.

In this PLL circuit, since the reference signals (FR1a to FR8a) are output one by one, the feedback signals (FV1 to FV8) are output one by one, and they are compared with each other sequentially, the phase comparing unit can be configured by a single phase comparator.

With this structure, phase comparisons can be performed for each of the reference signals having different phases by a single phase comparator, so the cost can be reduced. Moreover, the PLL circuit can be made small in size when implemented in an LSI since it has only one phase comparator.

A PLL circuit according to another aspect of the invention includes:
- a first frequency divider (71) dividing an output (fR) of a reference oscillator (4b) to output a reference signal (FR);
- a second frequency divider (72) dividing an output signal (VO) of a voltage-controlled oscillator (29b) to output a feedback signal (FV); and
- a phase comparator (12b) comparing phases between the reference signal (FR) and the feedback signal (FV);
- wherein the first frequency divider (71) performs frequency division by a small frequency-division ratio during start-up, and performs frequency division by a large frequency-division ratio near lock.

With this structure, since generating a plurality of reference signals having different phases is not necessary, the circuitry is simple, and the cost is therefore low. Moreover, since, during start-up, the first frequency divider performs frequency division by a small frequency-division ratio and accordingly the frequency of the reference signal is high, the phase comparisons are performed faster than after lock and the lock-up time is therefore shortened. In addition, since, near lock, the first frequency divider performs frequency division by a large frequency-division ratio and accordingly the frequency of the reference signal is low, it is possible to match the frequency of the reference signal with a channel spacing frequency.

In the PLL circuit, the second frequency divider (72) may perform frequency division by a frequency-division ratio setting of N/K during start-up, where K is a quotient of the large frequency-division ratio/the small frequency-division ratio, and N is the frequency-division ratio of the second frequency divider.

With this structure, since the set frequency during start-up and the set frequency near lock can be the same, it is possible to establish lock smoothly and shorten the lock-up time.

A PLL circuit according to another aspect of the invention includes:
- a first fixed frequency divider (103) dividing an output signal of a reference oscillator (102) by a frequency-division ratio of N1 (N1 being an integer);
- a second fixed frequency divider (105) dividing an intermediate signal (FR) output from a first voltage-controlled oscillator (104) by a frequency-division ratio of N2 (N2 being an integer);
- a first phase comparing unit (106) comparing phases between an output of the first fixed frequency divider (103) and an output of the second fixed frequency divider (105); and
- a converter (110) dividing the intermediate signal (FR) by a frequency-division ratio of N3 (N3 being an integer) to output a plurality of reference signals (FR1 to FR4) having different phases.

In this structure, if the reference frequency is A kHz, and the oscillation frequency is B kHz, then N=(B/A)×(N2/N3). Since the frequency-division ratio N1 of the first fixed frequency divider depends on a quotient of the oscillation frequency/the reference frequency, any oscillation frequency and reference frequency can be used without difficulty.

In this PLL circuit, the frequency-division ratio N2 may be equal to the frequency-division ratio N3.

In this structure, N1 is B/A. As explained above, the frequency-division ratio N1 of the first fixed frequency divider is identical with the quotient of the oscillation frequency/the reference frequency, and is a whole number. Accordingly the PLL circuit is easy to manufacture and low in cost.

The PLL circuit may include a variable frequency dividing unit (119, 121, 123, 125) dividing an output of a second voltage-controlled oscillator (118) and a second phase comparing unit (114 to 117) comparing phases between a plurality of the reference signals (FR1 to FR4) and outputs (FV1 to FV4) of the variable frequency dividing unit to output a plurality of phase comparison signals.

In this structure, the lock-up time is shortened since a plurality of the phase comparison signals are output to perform phase comparisons multiple times during one period of the reference signal.

The variable frequency dividing unit (119, 121, 123, 125) may be constituted by a single variable frequency divider or by a plurality of variable frequency dividers, and the second phase comparing unit (114 to 117) may be constituted by a single phase comparator or by a plurality of phase comparators.

In this structure, the variable frequency dividing unit and the second phase comparing unit can be configured either by a single variable frequency divider and a single phase comparator, or by a plurality of variable frequency dividers and a plurality of phase comparators, a layout of the PLL circuit can be selected flexibly within a given space. Moreover, the PLL circuit can be made small in size when implemented in an LSI if the variable frequency dividing unit and the second phase comparing unit are configured by a single variable frequency divider and a single phase comparator respectively.

A PLL circuit according to another aspect of the invention includes:

- a first fixed frequency divider (203) dividing an output of a reference oscillator (202) by a frequency-division ratio of N+1/2 (N being an integer);
- a second frequency divider (204) dividing an output of the first frequency divider (203) by two;
- a third fixed frequency divider (206) dividing an intermediate signal (FR) output from a first voltage-controlled oscillator (205) by a frequency-division ratio of N1 (N1 being an integer);
- a first phase comparing unit (207) comparing phases between an output of the second fixed frequency divider (204) and an output of the third fixed frequency divider (206) to output a phase comparison signal to the first voltage-controlled oscillator (205); and
- a converter (110) dividing the intermediate signal (FR) by a frequency-division ratio of N2 (N2 being an integer) to output a plurality of reference signals (FR1 to FR4) having different phases.

In this structure, if the reference frequency is A kHz, and the oscillation frequency is B kHz, then N+1/2=(B/2A)×(N1/N2). Since the frequency-division ratio N+1/2 of the first fixed frequency divider 203 depends on a quotient of the oscillation frequency/a multiple of the reference frequency, any oscillation frequency and reference frequency can be used without difficulty.

The first phase comparator (207) may be an EX-OR gate.

By supplying the signal with its frequency divided by 2 in the second fixed frequency divider to the first phase comparator, the duty ratio of this signal becomes 50%. In consequence, the first phase comparator can be constituted by a simple EX-OR gate. So, the cost is low and the PLL circuit can be made small in size when implemented in an LSI.

The converter (110) may output the reference signal (FR1 to FR8) the number of which is equal to the frequency-division ratio N2.

With this structure, a PLL circuit having any number of phase comparators can be configured easily.

In this PLL circuit, the frequency-division ratio N1 may be equal to the frequency-division ratio N2.

With this structure, since the frequency-division ratio N+1/2 of the first fixed frequency divider is identical with a quotient of the oscillation frequency/a multiple of the reference frequency, the first fixed frequency divider is easy to manufacture and is low in cost.

The PLL circuit may include a variable frequency dividing unit (119, 121, 123, 125) dividing an output signal (VO) of a second voltage-controlled oscillator (118) and a second phase comparing unit (114 to 117) comparing phases between a plurality of the reference signals (FR1 to FR4) with outputs (FV1 to FV4) of the variable frequency dividing unit to output a plurality of phase comparison signals.

In this structure, the lock-up time is shortened since a plurality of the phase comparison signals are output to perform phase comparisons multiple times during one period of the reference signal.

The variable frequency dividing unit (119, 121, 123, 125) may be constituted by a single variable frequency divider or by a plurality of variable frequency dividers, and the second phase comparing unit (114 to 117) may be constituted by a single phase comparator or by a plurality of phase comparators.

In this structure, the variable frequency dividing unit and the second phase comparing unit can be configured either by a single variable frequency divider and a single phase comparator, or by a plurality of variable frequency dividers and a plurality of phase comparators, a layout of the PLL circuit can be selected flexibly within a given space. Moreover, the PLL circuit can be made small in size when implemented in an LSI if the variable frequency dividing unit and the second phase comparing unit are configured by a single variable frequency divider and a single phase comparator respectively.

A PLL circuit according to another aspect of the invention includes:

- a first fixed frequency divider (303) dividing an output of a reference oscillator (302) by a frequency-division ratio of N1 (N1 being an integer);
- a second fixed frequency divider (305) dividing an output signal (FA) of a first voltage-controlled oscillator (304) by a frequency-division ratio of N2 (N2 being an integer);
- a first phase comparator (306) comparing phases between outputs of the first and second fixed frequency dividers;
- a third fixed frequency divider (309) dividing the output signal (FA) by a frequency-division ratio of N3 (N3 being an integer); and
- a converter (110) dividing an output (FR) of the third fixed frequency divider (309) by a frequency-division ratio of N4 (N4 being an integer) to output a plurality of reference signals (FR1 to FR4) having different phases.

In this structure, if the reference frequency is A kHz and the oscillation frequency is B kHz, then N1=(B/A)×(N2/(N3×N4)). Since the frequency-division ratio N1 of the first fixed frequency divider depends on a quotient of the oscillation frequency/the reference frequency, any oscillation frequency and reference frequency can be used without difficulty.

In this PLL circuit, the product of the frequency-division ratio N3 and the frequency-division ratio N4 may be equal to the frequency-division ratio N2.

In this structure, N1 is B/A. As explained above, the frequency-division ratio N1 of the first fixed frequency divider is identical with the quotient of the oscillation frequency B/the reference frequency A, that is a whole number. Accordingly the PLL circuit is easy to manufacture and low in cost.

A PLL circuit according to another aspect of the invention includes:

a first fixed frequency divider (403) dividing an output of a reference oscillator (402) by a frequency-division ratio of N+1/2 (N being an integer);

a second fixed frequency divider (405) dividing an output signal (FR) of a first voltage-controlled oscillator (404) by a frequency-division ratio of N1 (N1 being an integer);

a first phase comparator (406) comparing phases between outputs of the first and second fixed frequency dividers; and a converter (110) dividing the output signal (FR) by a frequency-division ratio of N2 (N2 being an integer) to output a plurality of reference signals (FR1 to FR4) having different phases.

In this structure, if the reference frequency is A kHz, and the oscillation frequency is B kHz, then N+1/2=(B/2A)×(2×N1/N2).

Since the frequency-division ratio N+1/2 of the first fixed frequency divider depends on the quotient of the oscillation frequency/a multiple of the reference frequency, any oscillation frequency and reference frequency can be used without difficulty.

In this PLL circuit, the multiple of the frequency-division ratio N1 may be equal to the frequency-division ratio N2.

In this structure, N+1/2 is B/2A. With this structure, since the frequency-division ratio N+1/2 of the first fixed frequency divider is identical with a quotient of the oscillation frequency/a multiple of the reference frequency, and N is an integer, the PLL circuit is easy to manufacture and low in cost.

The PLL circuit may include a variable frequency dividing unit (119, 121, 123, 125) dividing an output (VO) of a second voltage-controlled oscillator (118) and a second phase comparing unit (114 to 117) comparing phases between a plurality of the reference signal (FR1 to FR4) and outputs (FV1 to FV4) of the variable frequency dividing unit to output a plurality of phase comparison signals.

In this structure, the lock-up time is shortened since a plurality of the phase comparison signals are output to perform phase comparisons multiple times during one period of the reference signal.

The variable frequency dividing unit (119, 121, 123, 125) may be constituted by a single frequency divider or by a plurality of frequency dividers, and the second phase comparing unit (114 to 117) may be constituted by a single phase comparator or by a plurality of phase comparators.

In this structure, the variable frequency dividing unit and the second phase comparing unit can be configured either by a single variable frequency divider and a single phase comparator, or by a plurality of variable frequency dividers and a plurality of phase comparators, a layout of the PLL circuit can be selected flexibly within a given space. Moreover, the PLL circuit can be made small in size when implemented in an LSI if the variable frequency dividing unit and the second phase comparing unit are configured by a single variable frequency divider and a single phase comparator respectively.

What is claimed is:

1. A PLL circuit comprising:

a first fixed frequency divider (103) dividing an output signal of a reference oscillator (102) by a frequency-division ratio of N1 (N1 being an integer);

a second fixed frequency divider (105) dividing an intermediate signal (FR) output from a first voltage-controlled oscillator (104) by a frequency-division ratio of N2 (N2 being an integer);

a first phase comparator comparing phases between an output of the first fixed frequency divider (103) with an output of the second fixed frequency divider (105) to output a phase comparison signal to the first voltage-controlled oscillator (104); and a converter (110) dividing the intermediate signal (FR) by a frequency-division ratio of N3 (N3 being an integer) to output a plurality of reference signals (FR1 to FR4) having different phases;

further comprising a variable frequency dividing unit (119, 121, 123, 125) dividing an output of a second voltage-controlled oscillator (118) and a second phase comparing unit (114 to 117) comparing phases between the plurality of the reference signals (FR1 to FR4) with outputs (FV1 to FV4) of the variable frequency dividing unit to output a plurality of phase comparison signals to the second voltage-controlled oscillator (118).

2. A PLL circuit according to claim 1, in which the variable frequency dividing unit (119, 121, 123, 125) is constituted by a single frequency divider or by a plurality of frequency dividers, and the second phase comparing unit (114 to 117) is constituted by a single phase comparator or by a plurality of phase comparators.

3. A PLL circuit comprising:

a first fixed frequency divider (203) dividing an output of a reference oscillator (202) by a frequency-division ratio of N+1/2 (N being an integer);

a second fixed frequency divider (204) dividing an output of the first fixed frequency divider (203) by two;

a third fixed frequency divider (206) dividing an intermediate signal (FR) output from a first voltage-controlled oscillator (205) by a frequency-division ratio of N1 (N1 being an integer);

a first phase comparator (207) comparing phases between an output of the second fixed frequency divider (204) with an output of the third fixed frequency divider (206) to output a phase comparison signal to the first voltage-controlled oscillator (205); and a converter (110) dividing the intermediate signal (FR) by a frequency-division ratio of N3 (N2 being an integer) to output a plurality of reference signals (FR1 to FR4) having different phases.

4. A PLL circuit according to claim 3, in which the first phase comparator (207) comprises an EX-OR gate.

5. A PLL circuit according to claim 3, in which the converter (110) outputs the reference signals (FR1 to FR4) the number of which is equal to the frequency-division ratio N2.

6. A PLL circuit according to claim 3, in which the frequency-division ratio N1 and the frequency-division ratio N2 are the same with each other.

7. A PLL circuit according to claim 3, further comprising a variable frequency dividing unit (119, 121, 123, 125) dividing an output (VO) of a second voltage-controlled oscillator (118) and a second phase comparing unit (114 to 117) comparing phases between a plurality of the reference signal (FR1 to FR4) with outputs (FV1 to FV4) of the variable frequency dividing unit to output a plurality of phase comparison signals to the second voltage-controlled oscillator (118).

8. A PLL circuit according to claim 7, in which the variable frequency dividing unit (119, 121, 123, 125) is constituted by a single frequency divider or by a plurality of frequency dividers, and the second phase comparing unit (114 to 117) is constituted by a single phase comparator or by a plurality of phase comparators.

9. A PLL circuit comprising:
- a first fixed frequency divider (303) dividing an output of a reference oscillator (302) by a frequency-division ratio of N1 (N1 being an integer);
- a second fixed frequency divider (305) dividing an output signal (FA) received from a first voltage-controlled oscillator (304) by a frequency-division ratio of N2 (N2 being an integer);
- a first phase comparator (306) comparing phases between outputs of the first and second fixed frequency dividers;
- a third fixed frequency divider (309) dividing the output signal (FA) by a frequency-division ratio of N3 (N3 being an integer); and
- a converter (110) dividing an output (FR) of the third fixed frequency divider (309) by a frequency-division ratio of N4 (N4 being an integer) to output a plurality of reference signals (FR1 to FR4) having different phases.

10. A PLL circuit according to claim 9, in which a product of the frequency-division ratio N3 and the frequency-division ratio N4 is equal to the frequency-division ratio N2.

11. A PLL circuit according to claim 9, further comprising a variable frequency dividing unit (119, 121, 123, 125) dividing an output (VO) of a second voltage-controlled oscillator (118) and a second phase comparing unit (114 to 117) comparing phases between a plurality of the reference signals (FR1 to FR4) with outputs (FV1 to FV4) of the variable frequency dividing unit to output a plurality of phase comparison signals to the second voltage-controlled oscillator (118).

12. A PLL circuit according to claim 11, in which the variable frequency dividing unit (119, 121, 123, 125) is constituted by a single frequency divider or by a plurality of frequency dividers, and the second phase comparing unit (114 to 117) is constituted by a single phase comparator or by a plurality of phase comparators.

13. A PLL circuit comprising:
- a first fixed frequency divider (403) dividing an output signal of a reference oscillator (402) by a frequency-division ratio of N1/2 (N being an integer);
- a second fixed frequency divider (405) dividing an output signal (FR) received from a first voltage-controlled oscillator (404) by a frequency-division ratio of N1 (N1 being an integer);
- a first phase comparator (406) comparing phases between outputs of the first and second fixed frequency dividers; and
- a converter (110) dividing the intermediate signal (FR) by a frequency-division ratio of N2 (N2 being an integer) to output a plurality of reference signals (FR1 to FR4) having different phases;
- further comprising a variable frequency dividing unit (119, 121, 123, 125) dividing an output of a second voltage-controlled oscillator (118) and a second phase comparing unit (114 to 117) comparing phases between the plurality of the reference signals (FR1 to FR4) with outputs (FV1 to FV4) of the variable frequency dividing unit to output a plurality of phase comparison signals to the second voltage-controlled oscillator (118).

* * * * *